United States Patent
Visweswaran et al.

(10) Patent No.: US 8,823,463 B2
(45) Date of Patent: Sep. 2, 2014

(54) OSCILLATOR CIRCUIT AND METHOD FOR GENERATING AN OSCILLATION

(71) Applicant: Huawei Technologies Co., Ltd., Guangdong (CN)

(72) Inventors: Akshay Visweswaran, Delft (NL); Robert Bogdan Staszewski, Delft (NL); John Long, Delft (NL)

(73) Assignee: Huawei Technologies Co., Ltd. (CN)

( * ) Notice: Subject to any disclaimer, the term of this patent is extended or adjusted under 35 U.S.C. 154(b) by 37 days.

(21) Appl. No.: 13/687,685

(22) Filed: Nov. 28, 2012

(65) Prior Publication Data
US 2013/0162361 A1 Jun. 27, 2013

Related U.S. Application Data

(63) Continuation of application No. PCT/EP2011/073823, filed on Dec. 22, 2011.

(51) Int. Cl.
*H03B 5/12* (2006.01)

(52) U.S. Cl.
CPC .............. *H03B 5/12* (2013.01); *H03B 5/1265* (2013.01); *H03B 5/1228* (2013.01); *H03B 5/1296* (2013.01); *H03B 5/1218* (2013.01)
USPC ................. 331/117 FE; 331/108 B; 331/135

(58) Field of Classification Search
CPC ............. H03B 5/00; H03B 5/08; H03B 5/10; H03B 5/12; H03B 5/1203; H03B 5/1228; H03B 5/1231; H03B 5/1296; H03B 5/20; H03B 5/22; H03B 5/24; H03B 7/02; H03B 7/04; H03B 7/06

USPC ............ 331/108 B, 112, 117 FE, 117 R, 132, 331/135, 136, 146, 167
See application file for complete search history.

(56) References Cited

U.S. PATENT DOCUMENTS

| | | | |
|---|---|---|---|
| 2,745,009 A | 5/1956 | Moulon | |
| 3,061,797 A * | 10/1962 | Grenier | 331/114 |
| 3,157,841 A | 11/1964 | Gilbert | |
| 3,316,502 A * | 4/1967 | Karras | 331/108 B |
| 3,575,666 A * | 4/1971 | Fischman et al. | 331/20 |
| 3,651,428 A * | 3/1972 | Brander | 331/173 |
| 3,760,248 A * | 9/1973 | Nola et al. | 318/801 |
| 3,891,946 A | 6/1975 | Aker | |
| 4,459,566 A * | 7/1984 | Lane | 331/135 |
| 4,890,073 A | 12/1989 | Flachenecker et al. | |
| 5,600,280 A | 2/1997 | Zhang | |

OTHER PUBLICATIONS

Jean-Christophe Nallatamby, et al., "Phase Noise in Oscillators—Leeson Formula Revisited", IEEE Transactions on Microwave Theory and Techniques, vol. 51, No. 4, Apr. 2003, p. 1386-1394.

(Continued)

*Primary Examiner* — Levi Gannon
(74) *Attorney, Agent, or Firm* — Huawei Technologies Co., Ltd.

(57) ABSTRACT

The invention relates to an oscillator circuit, comprising a clipping element for generating a clipped signal, and a first amplification stage for amplifying and filtering the clipped signal to obtain a filtered signal, wherein the clipping element is configured to generate the clipped signal upon the basis of the filtered signal.

14 Claims, 28 Drawing Sheets

(56) References Cited

OTHER PUBLICATIONS

Jean-Olivier Plouchart, et al., "A Fully-Monolithic Sige Differential Voltage-Controlled Oscillator for 5 GHZ Wireless Applications", IEEE Radio Frequency Integrated Circuits Symposium, Jun. 11, 2000, p. 57-60.

Hao Shi, et al., "A 2.4 GHz fully integrated CMOS LC VCO", Solid-State and Integrated Circuits Technology, Oct. 18-21, 2004, p. 1329-1332.

M. Prigent, et al., "An Efficient Design Method of Microwave Oscillator Circuits for Minimum Phase Noise", IEEE Transactions on Microwave Theory and Techniques, vol. 47, No. 7, Jul. 1999, p. 1122-1125.

Ali Hajimiri, et al., "Design Issues in CMOS Differential LC Oscillators", IEEE Journal of Solid-State Circuits, vol. 34, No. 5, May 1999, p. 717-724.

Xuejin Wang, et al., "Systematic Design of Supply Regulated LC-Tank Voltage-Controlled Oscillators", IEEE Transactions on Circuits and Systems—I: Regular Papers, vol. 55, No. 7, Aug. 2008, p. 1834-1844.

David Cordeau, et al., "Minimum Phase Noise of an LC oscillator: Determination of the optimal operating point of the active part", AEU International Journal of Electronics and Communications, vol. 64, No. 9, Sep. 1, 2010, 11 pages.

G. Le Grand de Mercey, "A 18GHz Rotary Traveling Wave VCO in CMOS with I/Q outputs", European Solid-State Circuits Conference, Sep. 13, 2003, 4 pages.

International Search Report dated Dec. 6, 2012 in connection with International Patent Application No. PCT/EP2011/073823.

\* cited by examiner

OSCILLATOR CIRCUIT AND METHOD FOR GENERATING AN OSCILLATION

CROSS-REFERENCE TO RELATED APPLICATIONS

This application is a continuation of International Application No. PCT/EP2011/073823, filed on Dec. 22, 2011 which is hereby incorporated by reference in its entirety.

TECHNICAL FIELD

The present invention relates to the field of an oscillator, and in particular, to an oscillator circuit and a method for generating an oscillation.

BACKGROUND

In LC-oscillators, tank-passives are chosen with respect to the operating frequency, the available power budget and features offered by the technology-metallization and transistor behavior. Phase noise in the oscillator results from noise generated in the oscillator passives and the active devices used to sustain oscillations.

Thermal noise generated by parasitic resistance present in the oscillator passives gets shaped by the frequency response of the tank. To minimize this noise, the selectivity of the filter may be increased. This coincides with the well-established notion of maximizing the tank Q to improve the phase noise. This claim is quantified in Leeson's equation, where phase noise power is seen to reduce with the square of the tank quality factor. While operating at the lower end of the gigahertz spectrum, tank Q is dominated by the quality factor of the inductor.

Series resistance is encountered due to the limited conductivity of metal traces; while losses to the substrate increasingly degrade inductor Q with frequency. To reduce the series resistance in monolithic inductors, one can increase both thickness and width of the metal trace. While interconnect thickness is a fixed feature offered by the technology being used, increasing the width of metal traces trades quality factor for self-inductance and frequency of self-oscillation. Use of a lower metal to electrically shield the passive from the substrate has been shown to reduce quality factor degradation. A floating fishbone structure has been used to shield the octagonal laid-out interleaved transformers. Magnetically induced eddy current losses in the substrate continue to exist. For a targeted frequency of oscillation in a given technology, and a fixed power budget, the tank can be optimized by trading width of traces, self-inductance and bandwidth appropriately. Availability of a thicker metal can provide a greater Q.

Conventionally, cross-coupled negative, i.e. $-g_m$, oscillators usually form the basis for low-noise high-performance oscillator designs. Moreover, tail-current shaping, operation in class-C mode and higher order oscillators may also be deployed. However, the known oscillators may suffer from the fact that the noise contribution may convert to phase-noise. This may limit the lowest phase noise achievable.

SUMMARY

It is the object of the invention to provide a concept for a low phase noise oscillator.

This object is achieved by the features of the independent claims. Further implementation forms are apparent from the dependent claims, the description and the figures.

The invention is based on the finding that for minimizing phase noise, mechanisms which affect noise to phase-noise conversion, rather than only the noise itself may be targeted. A reduction of noise to phase-noise conversion is obtained by moderating the impulse sensitivity function (ISF).

With respect to the ISF, the linear time variant (LTV) model for phase noise defines the ISF which quantifies the sensitivity of the oscillating waveform to perturbation by a noise source at different time instances within one cycle. The ISF is a dimensionless function, and relates to the output waveform. It provides necessary insight into conversion of circuit noise to phase noise.

The ISF of an oscillator defines the step change in output phase, for an input noise pulse at different time instances within 1 time-period of the waveform. The existing phase is insensitive to noise injected at the peak of the oscillating waveform due to the restorative nature of the positive feedback-loop, as the devices approach compression. Noise injected at the peak causes amplitude-modulation and not phase-modulation, and the restorative nature of the active loop resists this change. During zero crossing, any noise injected in the oscillator directly perturbs the phase. In other words, the noise-to-phase noise conversion is maximum at zero crossing and minimum when the devices approach compression.

The ISF is obtained by tediously adding noise impulses at specified intervals into the oscillator tank and studying change in phase; or closely approximated by the time-derivative of the output waveform. Where the slope of the waveform is zero, noise injected in the oscillator does not perturb waveform phase. A clipped wave, as shown in FIG. 9, clipped for a time span Tc at node 'x' causes noise to be rejected in this time-window. In the corresponding ISF plot, the ISF equals zero during this span. This re-iterates the fact that the designed oscillator benefits from clipping provided the signal power and harmonic integrity is restored.

The ISF quantifies the sensitivity of the oscillating waveform to perturbation by a noise source at different time instances within one cycle. The existing phase is insensitive to noise injected at the peak of the oscillating waveform due to the compressive nature of the active devices. Noise injected at the peak purports amplitude-modulation and not phase-modulation, and the restorative nature of the active loop resists this change. During zero crossing, any noise injected in the oscillator directly perturbs the phase. In other words, the noise-to-phase noise conversion is maximum at zero crossing and minimum when the devices approach compression.

The active devices used for energy restoration contribute towards overall circuit noise as well. Be it in oscillators based on the negative ($-g_m$) principle or positive feedback, the active device adds considerable amount of noise. Leeson's model for phase noise incorporates this noise contribution by definition of the noise factor F. The cross-coupled negative $-g_m$ oscillator gives optimal phase noise performance when operated at the edge of the current-limited mode where the circuit obtains maximum output swing for the given bias current. In the current-limited region, one has the flexibility to use the inductor and bias current as individual variables to increase the oscillation amplitude. Increase in output amplitude with bias current can be observed till the amplitude eventually gets limited by the supply voltage and begins to clip. Here, the oscillator transitions from current-limited operation to voltage-limited operation. With further increase in bias current the output noise power increases while signal power doesn't. This translates to a degradation in F.

If the oscillating waveform were to exhibit a peak which spanned half the time-period, the amount of circuit noise converted to phase noise will reduce significantly. The only contribution phase noise would result from noise injected in the small time window, where the transition from peak to through (and vice versa) through zero-crossing occurs. Implementation forms of the oscillator circuit are designed to work on this principle and provide substantially lower phase noise when compared to the negative (−gm) based oscillator. Operating the oscillator circuit in the previously discussed voltage-limited mode provides clipping and therefore noise insensitivity in the clipped region. Implementation forms of the oscillator circuit are designed being capable of preserving this advantage without degrading the noise factor as seen in negative −gm oscillators.

In order to describe the invention in detail, the following terms, abbreviations and notations will be used:

Q, Q factor: Quality factor. The Q factor is a widespread measure used to characterise oscillators. It is defined as the peak energy stored in the circuit divided by the average energy dissipated in it per cycle at oscillation. Low Q circuits are therefore damped and lossy and high Q circuits are underdamped. Q is related to bandwidth; low Q circuits are wide band and high Q circuits are narrow band. In fact, it happens that Q is roughly the inverse of fractional bandwidth: Q=1/$F_b$=$\omega_0/\Delta\omega$). Q factor is directly proportional to selectivity, as Q factor depends inversely on bandwidth.

Tank Q: Quality factor of an oscillator. The energy in an oscillator oscillates back and forth between the capacitor and the inductor until internal resistance makes the oscillations die out. Its action is similar to water sloshing back and forth in a tank. For this reason the oscillator circuit is also called a tank circuit and the quality factor of the oscillator is called the tank Q.

Leeson's equation:

$$\pounds(f_m) = 10\log\left\{\frac{FkT}{2P_{avs}}\left[1 + \frac{f_c}{f_m} + \left(\frac{f_o^2}{2f_m Q_t}\right)^2\left(1 + \frac{f_c}{f_m}\right)\right]\right\},$$

where Q1 is the loaded Q of the circuit, $f_m$ is the frequency from the carrier, $f_c$ is the flicker noise corner frequency, $f_o$ is the carrier (oscillator) frequency, T is the temperature in Kelvin, $P_{avs}$ is the power through the oscillator, F is the noise factor of the active device, and k is the Boltzmann constant.

ISF: impulse sensitivity function −$g_m$ oscillator:negative conductance oscillator. A negative conductance can be implemented, for example, by a tunnel diode. In the tunnel diode, the dopant concentration in the p and n layers are increased to the point where the reverse breakdown voltage becomes zero and the diode conducts in the reverse direction. However, when forward-biased, an odd effect occurs called "quantum mechanical tunneling" which gives rise to a region where an increase in forward voltage is accompanied by a decrease in forward current. This negative resistance region can be exploited in negative conductance oscillators.

LTV model: linear time variant model

FOM: Figure of merit. A figure of merit is a quantity used to characterize the performance of a device, system or method, relative to its alternatives. In engineering, figures of merit are often defined for particular materials or devices in order to determine their relative utility for an application. For an oscillator, the FOM can be calculated, for example, according to the formula:

FOM(dBF)=20 log(Delta_$f$/freq)−$PN$−10 log(power), where "freq" designates the oscillation frequency, "Delta_f" designates the offset frequency from the average or expected oscillation frequency, "PN" the phase noise and "power" the oscillation power.

According to a first aspect, the invention relates to an oscillator circuit, comprising a clipping element for generating a clipped signal, and a first amplification stage for amplifying and filtering the clipped signal to obtain a filtered signal, the filtered signal comprising an oscillation, wherein the clipping element is configured to generate the clipped signal upon the basis of the filtered signal. The filtered signal can be outputted by the oscillator circuit as oscillator signal. Moreover, the filtered signal can additionally be amplified prior to clipping.

The oscillator circuit according to the first aspect may have a low phase noise within given power constraints, supports device and supply noise reduction and has a high output swing that is not limited by supply voltage. The oscillator circuit is tailored for high power base-station applications, though the concept is readily applicable to ultra-low-power oscillators intended for handset applications.

In a first possible implementation form of the oscillator circuit according to the first aspect, the first amplification stage comprises an amplifier, in particular a passive amplifier, for amplifying the clipped signal, and a filter for filtering the amplified clipped signal to obtain the filtered signal.

In a second possible implementation form of the oscillator circuit according to the first aspect as such or according to the first implementation form of the first aspect, either the first amplification stage or the second amplification stage is configured to introduce a phase shift by 180°.

In a third possible implementation form of the oscillator circuit according to the first aspect as such or according to the any of the preceding implementation forms of the first aspect, the first amplification stage is configured for suppressing frequency tones which are other, e.g. higher, than a fundamental tone in the clipped signal.

In a fourth possible implementation form of the oscillator circuit according to the first aspect as such or according to the any of the preceding implementation forms of the first aspect, a step-up transformer is provided, with a primary winding and a secondary winding, wherein an output of the clipping element is coupled to the primary winding, and wherein a filter, in particular a capacitor, is coupled to the secondary winding. The step-up transformer can form an impedance transformer.

In a fifth possible implementation form of the oscillator circuit according to the first aspect as such or according to the any of the preceding implementation forms of the first aspect, the first amplification stage comprises a step-up transformer, in particular an impedance transformer, for amplifying the clipped signal, and a filter coupled to a secondary winding of first step-up transformer for filtering the amplified clipped signal to obtain the filtered signal, and the second amplification stage comprises a step-up transformer, and a secondary winding of the step-up transformer of the first amplification stage is coupled to a primary winding of the step-up transformer of the second amplification stage.

In a sixth possible implementation form of the oscillator circuit according to the first aspect as such or according to the any of the preceding implementation forms of the first aspect, the oscillator circuit further comprises a second amplification stage for amplifying the filtered signal to obtain an amplified filtered signal as the filtered signal.

In an seventh possible implementation form of the oscillator circuit according to the first aspect as such or according to the any of the preceding implementation forms of the first aspect, an output of the second amplification stage is coupled to an input of the clipping element.

In a eighth possible implementation form of the oscillator circuit according to one of the preceding implementation forms sixth or seventh of the first aspect, the clipping element comprises at least a transistor for clipping, in particular a MOS transistor, and an output of the second amplification stage is coupled to a gate terminal of the transistor.

In a ninth possible implementation form of the oscillator circuit according to one of the preceding implementation forms sixth or eighth of the first aspect, the clipping element comprises an amplifier.

In a tenth possible implementation form of the oscillator circuit according to the ninth implementation form, the clipping element comprises a clipping diode arranged downstream of the amplifier.

In a eleventh possible implementation form of the oscillator circuit according to the ninth or tenth implementation form, the amplifier is configured to introduce a phase shift of 180°.

In a twelfth possible implementation form of the oscillator circuit according to one of the preceding implementation forms sixth to eleven of the first aspect, the second amplification stage comprises a passive or an active amplifier.

In a thirteenth possible implementation form of the oscillator circuit according to one of the preceding implementation forms sixth to twelve of the first aspect, the second amplification stage comprises a step-up transformer, and a secondary winding of the step-up transformer is coupled to the clipping element.

In a fourteenth possible implementation form of the oscillator circuit according to one of the preceding implementation forms sixth to thirteen of the first aspect, at least one switchable frequency tuning circuit is coupled to an input of the second amplification stage.

In a fifteenth possible implementation form of the oscillator circuit according to one of the preceding implementation forms sixth to fourteen of the first aspect, at least a transistor for clipping, in particular a MOS transistor, is provided, wherein an output of the second amplification stage is coupled to a gate terminal of the transistor.

In a sixteenth possible implementation form of the oscillator circuit according to one of the preceding implementation forms sixth to fifteen of the first aspect, at least one switchable frequency tuning circuit is coupled to an input of the second amplification stage.

In an seventeenth possible implementation form of the oscillator circuit according to the first aspect as such or according to the any of the preceding implementation forms of the first aspect, the oscillator circuit comprises a further clipping element for generating a further clipped signal; wherein the first amplification stage is configured for amplifying and filtering the further clipped signal to obtain a further filtered signal; and wherein the further clipping element is configured to generate the further clipped signal upon the basis of the further filtered signal. The further filtered signal can be output as a further filtered signal.

In a eighteenth possible implementation form of the oscillator circuit according to the seventeenth implementation form of the first aspect, the oscillator circuit further comprises a second amplification stage for amplifying the further filtered signal to obtain a further amplified filtered signal as the further filtered signal.

In a nineteenth possible implementation form of the oscillator circuit according to the eighteenth implementation form of the first aspect, at least one switchable frequency tuning circuit is coupled to an input of the second amplification stage.

In a twentieth possible implementation form of the oscillator circuit according to the first aspect as such or according to the any of the preceding implementation forms of the first aspect, a control input of the clipping element (101) is coupled to a desensitizing capacitor.

According to a second aspect, the invention relates to method for generating an oscillation, the method comprising generating a clipped signal, amplifying and filtering the clipped signal to obtain a filtered signal, the filtered signal comprising an oscillation; wherein the clipped signal is generated upon the basis of the filtered signal.

In a possible implementation form of the method according to the second aspect, the method further comprises amplifying the filtered signal.

BRIEF DESCRIPTION OF THE DRAWINGS

Further embodiments of the invention will be described with respect to the following figures, in which.

DETAILED DESCRIPTION

Figure 1A:
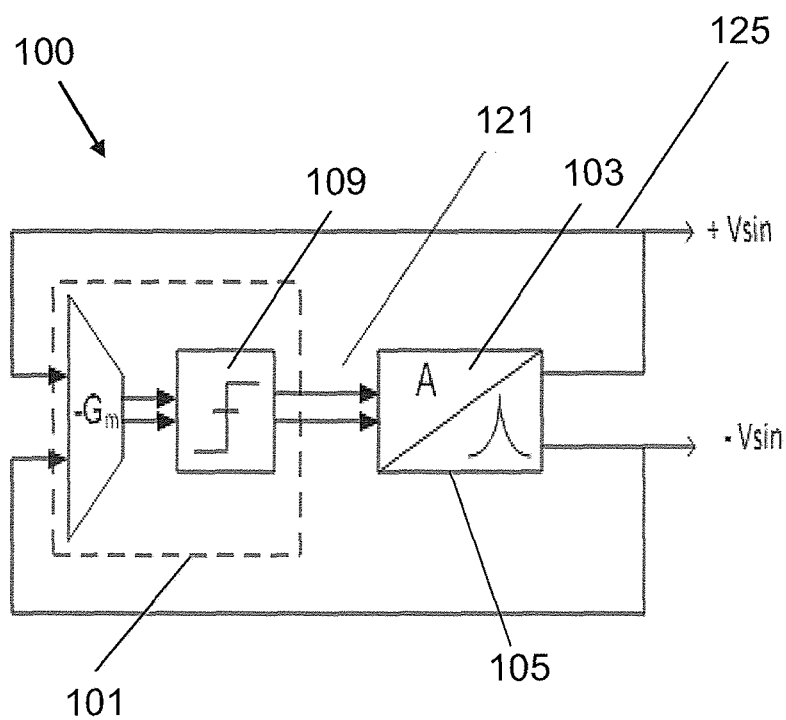
FIG. 1a, 1b show block diagrams of an oscillator circuit according to an implementation form.
Figure 1B:
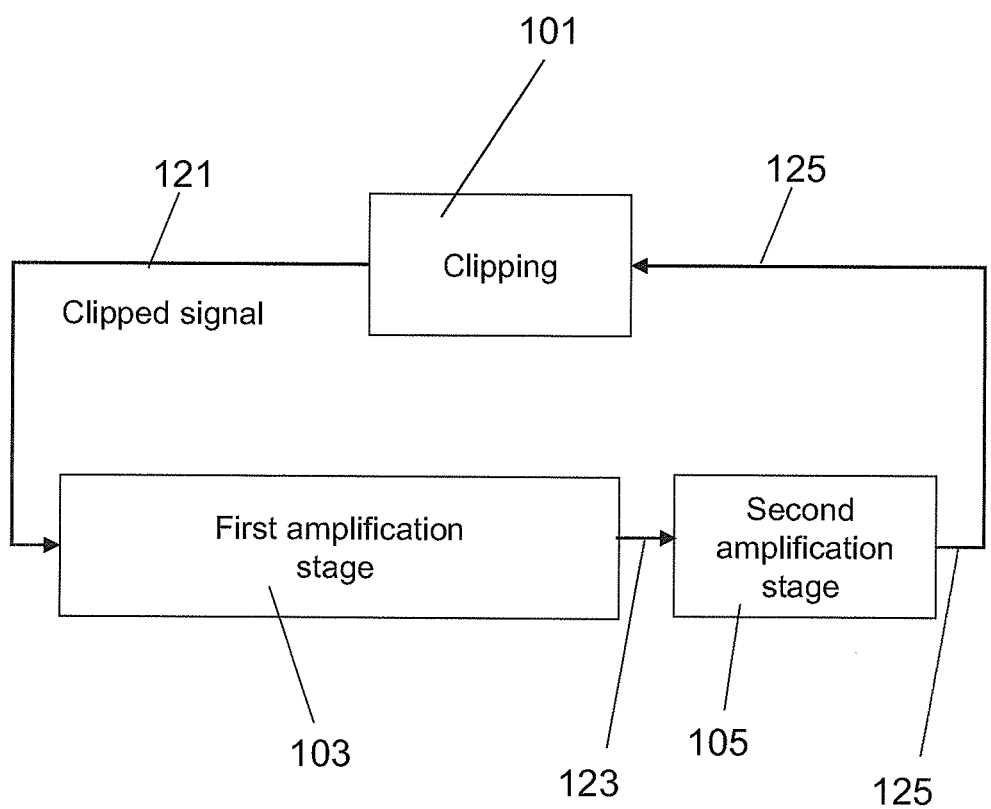

FIGS. 1a and 1b show block diagrams of an oscillator circuit 100 comprising an oscillation according to an implementation form. The oscillator circuit 100 comprises a clipping element 101 for generating a clipped signal 121, a first amplification stage 103 for amplifying and filtering the clipped signal 121 to obtain a filtered signal 123, and, optionally, a second amplification stage 105 for amplifying the filtered signal 123 to amplify the filtered signal 123 ob obtain an amplified filtered signal 125. The clipping element 101 generates the clipped signal 121 upon the basis of the filtered signal 125.

An output of the clipping element 101 is connected to an input of the first amplification stage 103. An output of the first amplification stage 103 is connected to an input of the second amplification stage 105. An output of the second amplification stage 105 whose output is an output of the oscillator circuit 100 is connected to an input of the clipping element 101. It should be noted that the output of the oscillator circuit 100 does not necessarily have to be the signal Vsin or 125. In another implementation form, it could be an internal signal of the amplification/filtering block 103/105 after an adequate filtering of the clipped signal 121.

The clipping element 101 comprises a $-g_m$ stage 107 forming an amplifier and a clipping stage 109 connected in series, according to an implementation form.

According to another implementation form, the clipping operation can be implicit or explicit to the amplifier functionality. Also, explicit diodes could be used. The clipping operation can be unidirectional as shown in FIG. 1 or bidirectional. The first amplification stage 103 comprises according to an implementation form an amplifier and a filter. The clipped signal 121, the filtered signal 123 and the filtered signal 125 comprise two polarities +Vsin and −Vsin.

Figure 2:
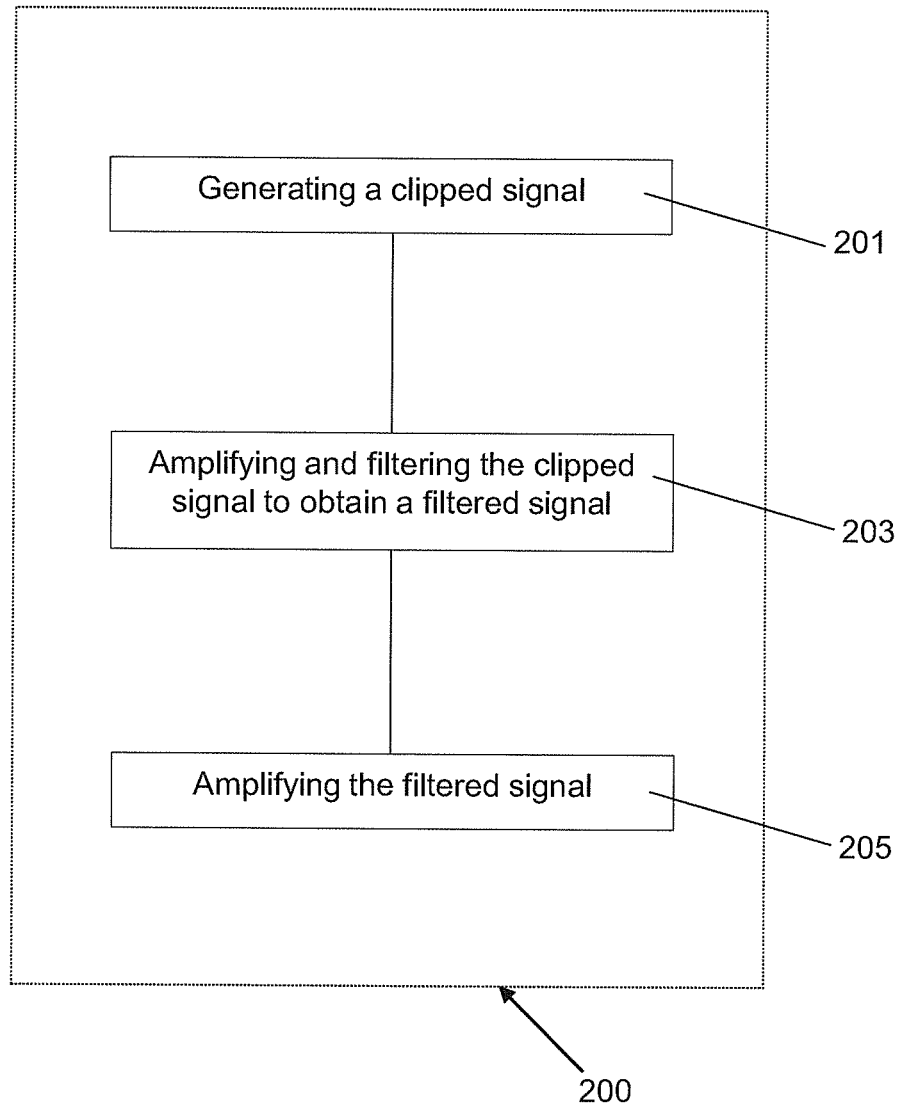
FIG. 2 shows a schematic diagram of a method for generating a filtered signal according to an implementation form.

FIG. 2 shows a schematic diagram of a method for generating a filtered signal according to an implementation form. The method 200 comprises: generating 201 a clipped signal; amplifying and filtering 203 the clipped signal to obtain a filtered signal; and amplifying 205 the filtered signal to obtain the filtered signal; wherein the clipped signal is generated upon the basis of the filtered signal. It should be noted that the 203 and 205 steps could be reversed in some implementation forms and even step 205 can be bypassed.

Figure 3:
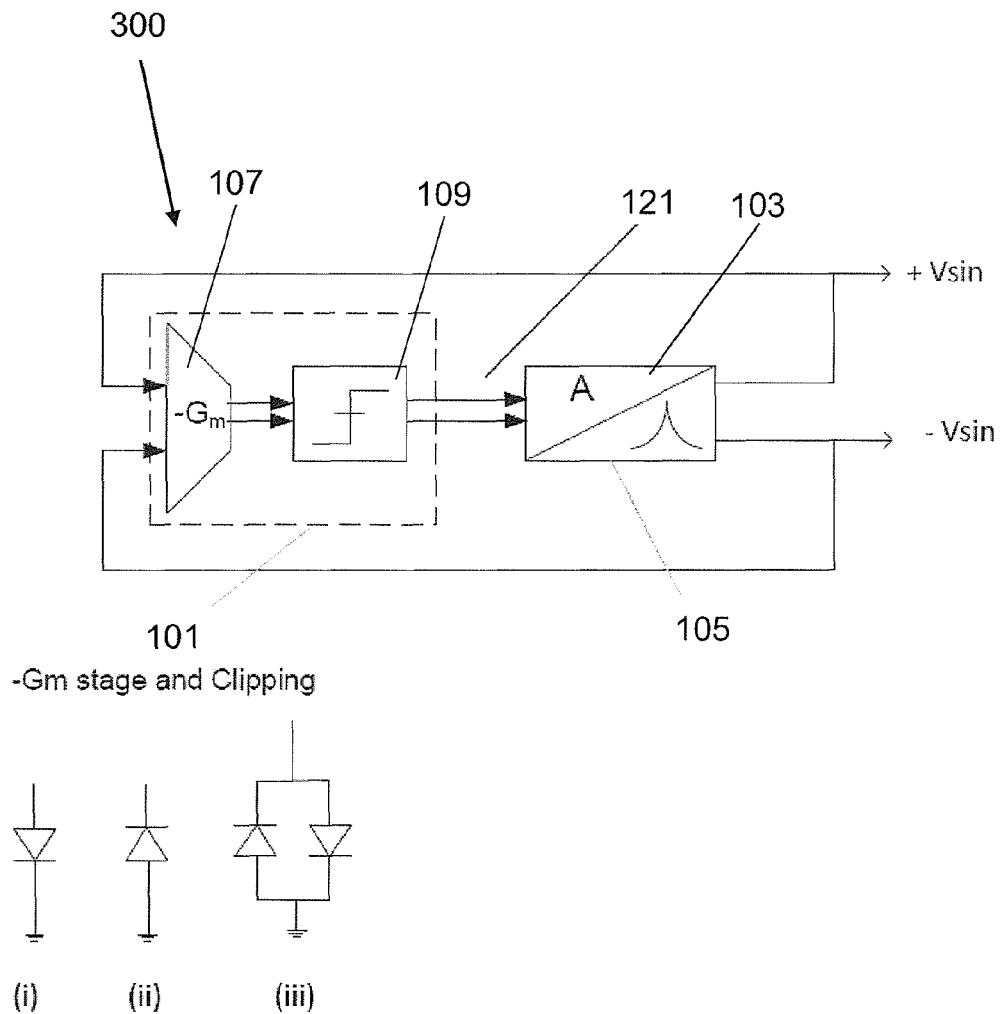
FIG. 3 shows a block diagram of an oscillator circuit according to an implementation form.

FIG. 3 shows a block diagram of an oscillator circuit 300 according to an implementation form. The oscillator circuit 300 corresponds to the oscillator circuit 100 depicted in FIG. 1. The clipping element 101 comprises a $-g_m$ stage 107 forming an amplifier and an implicit clipping stage 109. The clipping element 101 may be realized by one of the possible clipping/clamping/voltage swing limiting modes:

1) Inherent clipping due to practical implementation of −gm stage 107 with PMOS device, provides clipping as will be provided by (i).
2) Inherent clipping due to practical implementation of −gm stage 107 with NMOS device, provides clipping as will be provided by (ii).
3) Inherent clipping due to practical implementation of −gm stage 107 with NMOS and/or PMOS device, provides clipping as will be provided by (iii).

Figure 5:
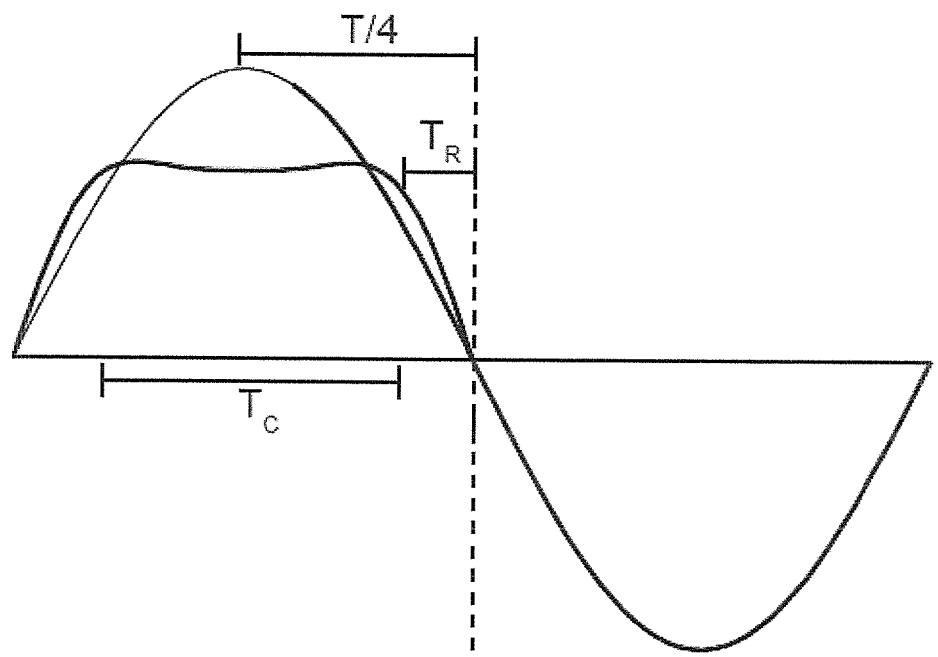
FIG. 5 shows a waveform diagram of a clipping signal according to an implementation form.
Figure 6:
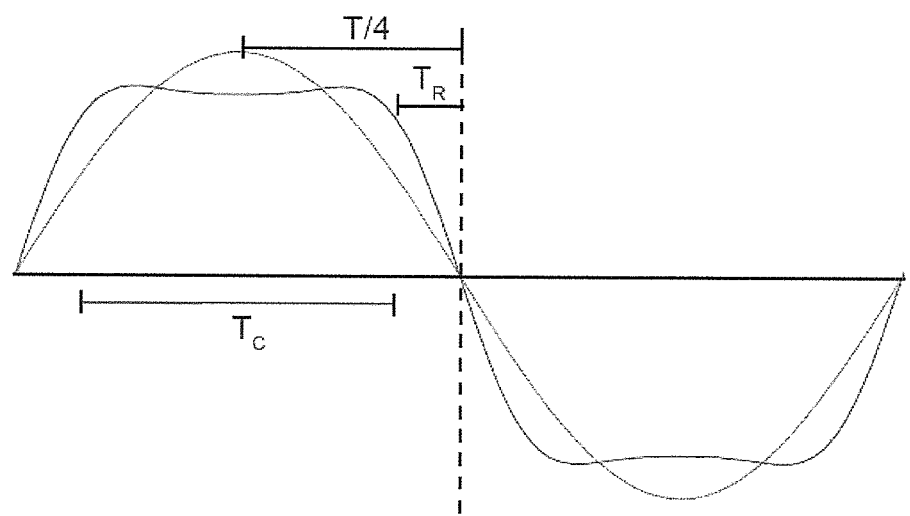
FIG. 6 shows a waveform diagram of a clipping signal according to an implementation form.

For an implementation according to (i), the waveform of the clipping signal 121 is schematically represented in FIG. 5. For an implementation according to (ii), the second half instead of the first half of the waveform depicted in FIG. 5 is clipped. For an implementation according to (iii), the waveform of the clipping signal 121 is schematically represented in FIG. 6.

Figure 4:
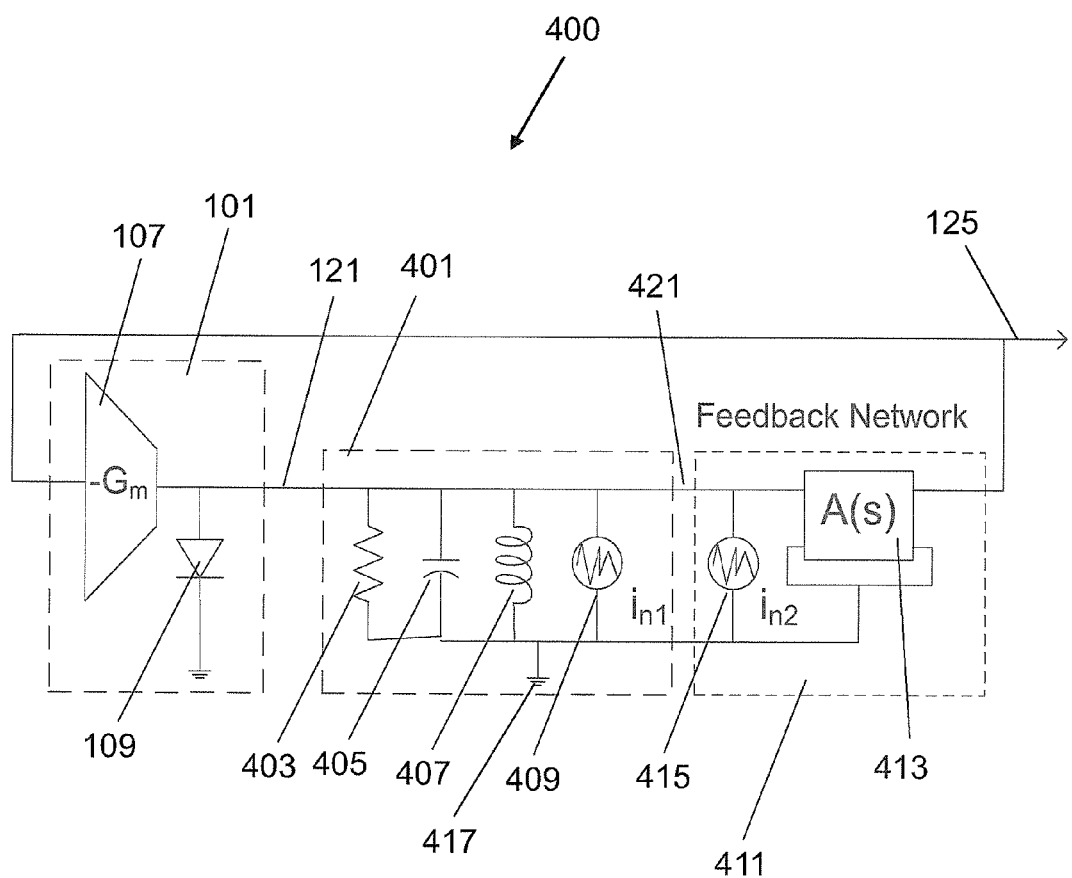
FIG. 4 shows a block diagram of an oscillator circuit according to an implementation form.

FIG. 4 shows a block diagram of an oscillator circuit 400 according to an implementation form of the oscillator circuit 100 shown in FIGS. 1a and 1b. The oscillator circuit 400 comprises the clipping element 101 for generating the clipped signal 121; a first amplification stage 401 for amplifying and filtering the clipped signal 121 to obtain the filtered signal 123; and a second amplification stage 411 for amplifying the filtered signal 123 to obtain the filtered signal 125. The clipping element 101 generates the clipped signal 121 upon the basis of the filtered signal 125.

An output of the clipping element 101 is connected to an input of the first amplification stage 401. An output of the first amplification stage 401 is connected to an input of the second amplification stage 411. An output of the second amplification stage 411, which output is an output of the oscillator circuit 400 is connected to an input of the clipping element 101.

The clipping element 101 comprises a $-g_m$ stage 107 forming an amplifier and a clipping stage 109. The clipping stage 109 is realized by a diode according to the PMOS device as described with respect to implementation (i) described in FIG. 3. The first amplification stage 401 comprises a parasitic resistance 403, a capacitance 405, an inductance 407 and a parasitic noise source 409 connected in parallel to ground 417 and provides a first amplified signal 421 which is input to the second amplification stage 411. The second amplification stage 411 comprises a parasitic noise source 415 and an amplifier network A(s) 413 connected in parallel to ground 417 and provides the filtered signal 125. The clipped signal 121, the filtered signal 123 and the filtered signal 125 comprise two polarities, wherein the negative one is connected to ground 417.

Phase noise in tuned oscillators arises mainly due to noise from active devices and oscillator passives. This sets up a quest for maximum tank-Q and a trade-off between power consumption and phase noise. The oscillator circuit performs voltage waveform manipulation as a means to reduce phase noise. A 9 dB improvement in figure-of-merit (FOM) may be observed at 1 MHz offset, when compared to a reference cross-coupled oscillator prototyped on the same die.

FIG. 5 shows a waveform diagram of a clipping signal according to an implementation form.

In the following, the principle of an oscillation circuit according to implementation forms is explained by referring to FIG. 5. As the amplitude of the signal driving a PMOS gate increases, the device gets driven into strong-inversion accompanied by drop in $|V_{DS}|$. The two simultaneous events expedite the transition of the device from the saturation to the triode region of operation. While operating in the triode region, gate control on channel charge reduces and the output current is seen to vary linearly with $|V_{DS}|$. It is at this juncture that the output begins to clip. The lateral electric field drops with $|V_{DS}|$ thereby limiting the channel conductivity. The output finally clips at a minimum $|V_{DS}|$ which is a maximum voltage below $V_{DD}$ below which increase in channel current is not obtained.

A clipped waveform, similar to a square wave, shows an increase in power at odd-harmonics. It can be interpreted that increasing the gate-driving signal causes the device to lose gain at the fundamental, and this gain gets distributed to the harmonics. The boost in third harmonic has a dominating effect on the output waveform as it is least attenuated by the LC-tank's frequency response. As a consequence, though the amplitude is reduced, the time span of noise insensitivity is stretched across what can be alluded to as flattening of the amplitude around the peak. This is indicated in FIG. 5 as $T_C$. It can be seen that noise-insensitivity obtained is dramatically increased from a single time instance to a sizable time window $T_C$. Secondly, the slope around the zero crossing point steepens, thereby minimizing the time window available for noise to phase-noise conversion around the point of maximum sensitivity. This is indicated in FIG. 5 as $T_R$. The value of $T_R$ can be interpreted as a rise or fall time, and can be reduced by increasing the amplitude of the voltage signal driving the input.

According to implementation form, oscillator circuits according to implementation forms benefit from this advantage, as the achievable signal swing is not limited by the supply voltage from which it is operated.

During the second half of the cycle, when the circuit implementation has been done with PMOS transistors only, the oscillator is free to swing till a minimum voltage of –Vdd in theory. In cross-coupled oscillators, it has been shown that increasing the biasing current of the transistor beyond its point of saturation, leads to degradation in the noise factor F. This can partly be ascribed to the impact of the MOS device's transition through different operating regions when driven by a large voltage swing; and to the fact that the gate is driven by the same waveform seen at the output, which is clipped and therefore, rich in harmonic content.

According to the LTV phase noise model, circuit noise-to-phase noise conversion is maximum at zero-crossing and minimum at the peak of the oscillating waveform. The oscillator circuit shown in FIG. 4 yields a clipped waveform with a peak, which spans a sizable time-window indicated in FIG. 5 as Tc. As can be inferred from the impulse-sensitivity-function (ISF) as well, noise injected in this time span doesn't perturb the waveform phase and thus doesn't contribute to phase noise. Secondly, the slope around zero-crossing steepens, thereby minimizing the time window available for noise to phase noise conversion around the point of maximum sensitivity. The roll-off time indicated in FIG. 5 as $T_R$ can be reduced by increasing the amplitude of the voltage signal driving the input.

Though a clipped waveform has a desirable impulse-sensitivity-function (ISF), the power at the fundamental tone drops, and gets distributed to the harmonics. Therefore, the oscillator circuit according to implementation forms inserts a feedback network capable filtering out the fundamental tone and stepping it up for an increased input drive for the gm stage, as can be seen from FIG. 3. A large input drive ensures smaller $T_R$ and a higher SNR from the active gm stage, which improves phase noise.

In fact, in a theoretical scenario where $T_R$ equals 0, it can be claimed that the entire noise contribution coming from the active devices does not affect oscillator phase noise. While tank-Q and device noise are largely technology dependent, the ISF of a clamped waveform isn't.

FIG. 6 shows a waveform diagram of a clipping signal according to an implementation form.

In an implementation form, the oscillator circuit is implemented with PMOS transistors only. This, as has been explained, results in waveform clipping only during have the oscillation cycle. In an alternative implementation form, an oscillator circuit describing a complementary oscillator is designed where the waveform can be clipped at both supply rails –Vdd and ground. Such an implementation form is represented in FIG. 3 when the clipping element 101 is designed according to implementation (iii). This might prove a more useful solution when the circuit is intended for ultra-low power applications, since the maximum voltage swing at the oscillator output would be limited to Vdd. An illustration of a double-clipped waveform is shown in FIG. 6. Here noise contribution can be suppressed in both half cycles of the periodic waveform.

Figure 7:
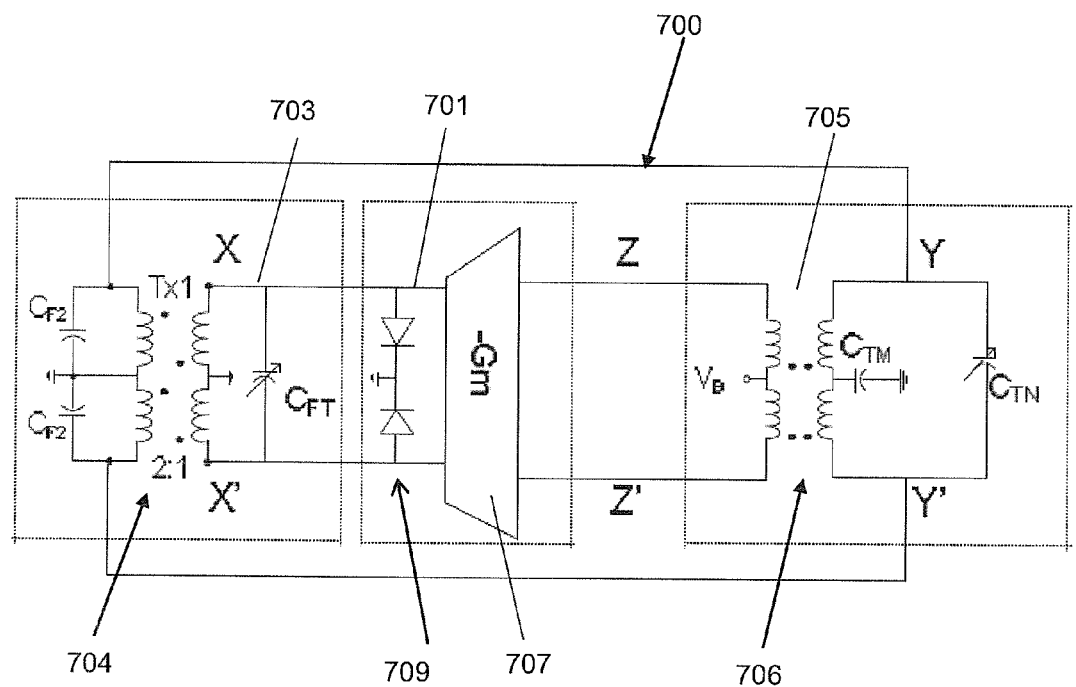
FIG. 7 shows a block diagram of an oscillator circuit according to an implementation form.

FIG. 7 shows a block diagram of an oscillator circuit 700 according to an implementation form.

The oscillator circuit 700 comprises a clipping element 701 for generating a clipped signal X; a first amplification stage 703 for amplifying and filtering the clipped signal X to obtain a filtered signal Y; and a second amplification stage 705 for amplifying the filtered signal Y to obtain the filtered signal Z. The clipping element 701 generates the clipped signal X upon the basis of the filtered signal Z.

An output of the implicit clipping element 701 is connected to an input of the first amplification stage 703. An output of the first amplification stage 703 is connected to an input of the second amplification stage 705. An output of the second amplification stage 705 whose output is an output of the oscillator circuit 700 is connected to an input of the clipping element 701.

The clipping element 701 comprises a $-g_m$ stage 707 forming an amplifier and a clipping stage 709 connected in series. The first amplification stage 703 comprises a transformer 704 (TX1) for transforming the clipped signal X to obtain the filtered signal Y. The second amplification stage 705 comprises a transformer 706 for transforming the filtered signal Y to obtain the filtered signal Z. The clipped signal X, the filtered signal Y and the filtered signal Z comprise two polarities depicted by (X, X'), (Y, Y') and (Z, Z').

Figure 8:
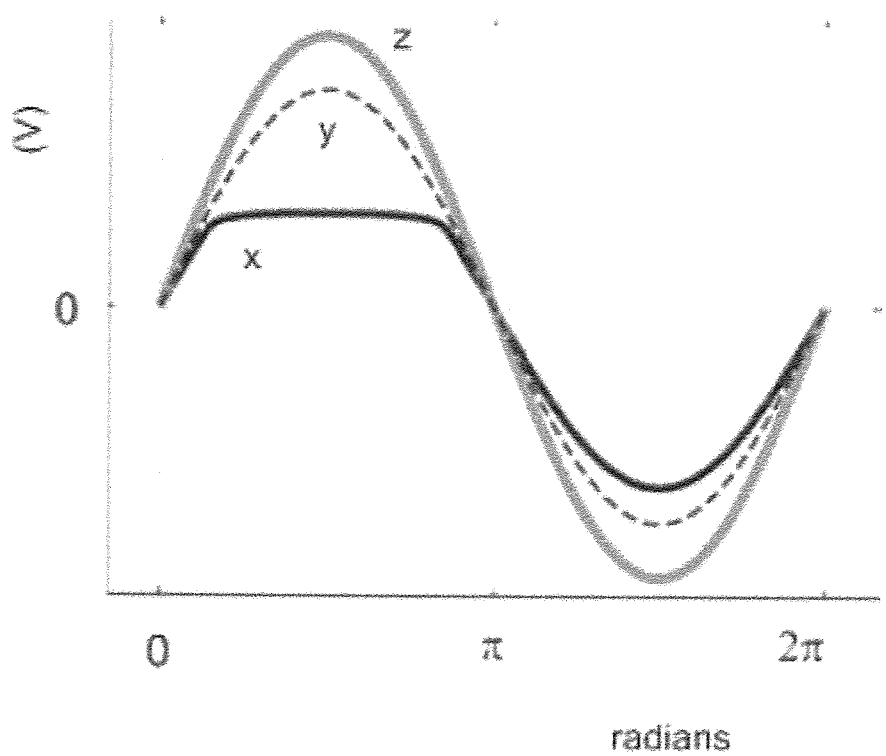
FIG. 8 shows a waveform diagram of signals measured at different nodes in an oscillator circuit according to an implementation form.

FIG. 8 shows a waveform diagram of signals measured at different nodes in an oscillator circuit according to an implementation form. A first waveform x corresponds to the clipped signal X as described with respect to FIG. 7, a second waveform y corresponds to the filtered signal Y as described with respect to FIG. 7 and a third waveform z corresponds to the filtered signal Z as described with respect to FIG. 7.

Figure 9:
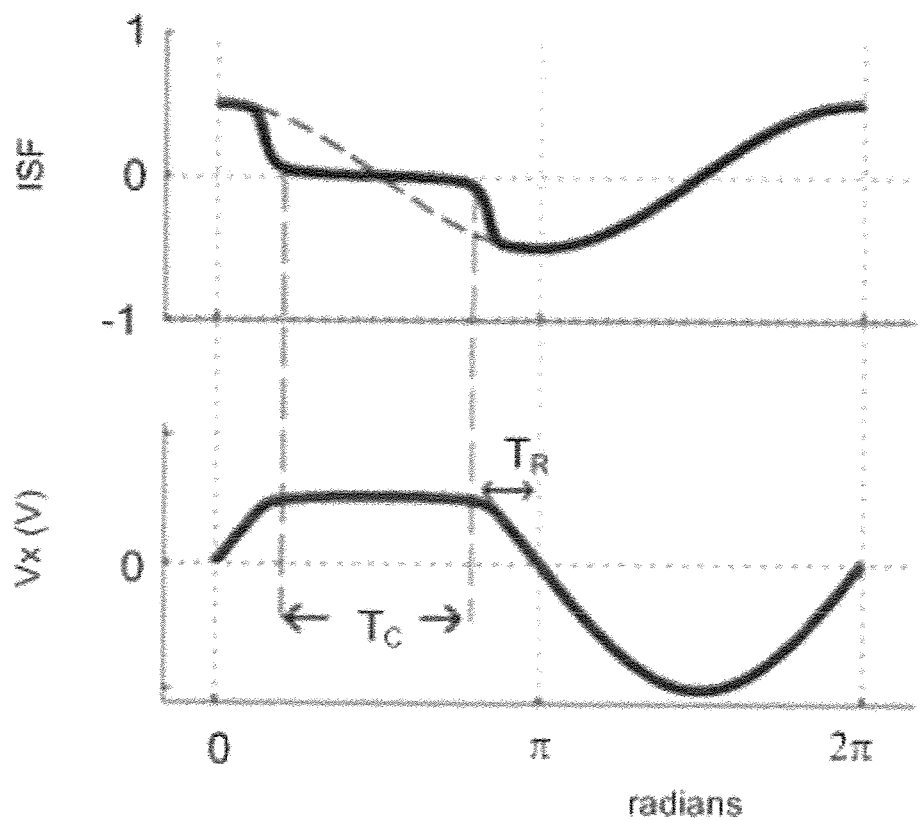
FIG. 9 shows a waveform diagram of a clipping signal and the associated impulse sensitivity function according to an implementation form.

FIG. 9 shows a waveform diagram of a clipping signal and the associated impulse sensitivity function according to an implementation form. The clipping signal Vx(V) corresponds to the signal x measured at node X as described with respect to FIG. 7. The ISF is zero within the clipping region $T_C$ and unequal to zero outside the clipping region.

Figure 10:
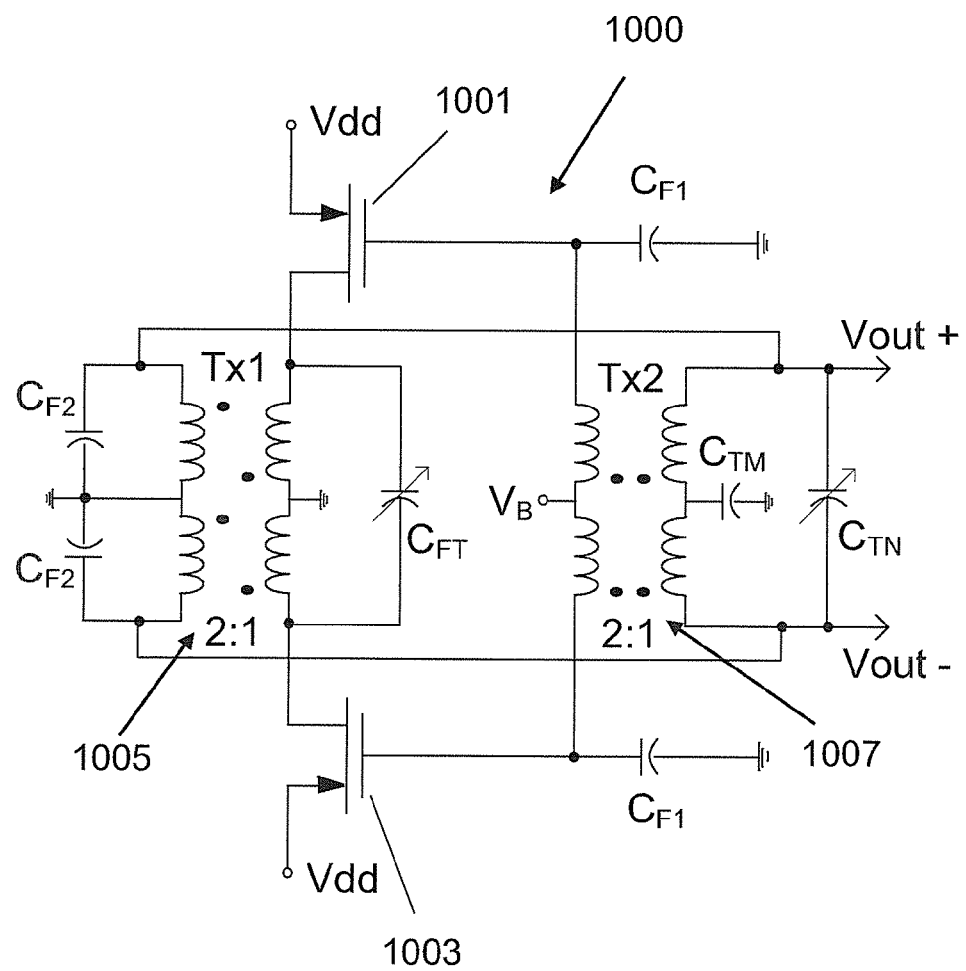
FIG. 10 shows a block diagram of an oscillator circuit according to an implementation form.

FIG. 10 shows a block diagram of an oscillator circuit 1000 according to an implementation form.

The oscillator circuit is symmetrically designed and comprises clipping elements 1001 and 1003 being formed by transistors. Outputs of the clipping elements 1001 and 1003 are coupled to primary windings of a first step-up transformer (Tx1) 1005 forming a first amplification stage. Parallel to the primary windings of the first step-up transformer 1005, a capacitor $C_{TN}$, which can be variable, is arranged. The first step-up transformer 1005 has secondary windings to which capacitors CF1 and CF2 forming a filter are connected. The outputs of the secondary windings of the first step-up transformer 1005 are connected to inputs of primary windings of a second step-up transformer 1007 forming a second amplification stage. Parallel to the primary windings, a capacitor $C_{TN}$, which can be variable, is connected. The secondary windings of the second step-up transformer are connected to control inputs of the clipping elements 1001, 1003, e.g. to gate inputs of transistors forming the clipping elements 1001, 1003. The control inputs of the clipping elements 1001, 1003 can respectively be connected to capacitors CF1.

In the oscillator circuit 1000, the fundamental tone is recovered in the primary winding of the first step-up transformer 1005 as shown in FIG. 10, where the harmonic currents flow to ground in the parallel capacitors CF2. The gate of the transistors is driven by a stepped up version of the filtered waveform. This is used to deal with the second aspect, that of noise reduction in the active device itself. A larger gate drive ensures a larger SNR in the output current waveform of the MOS transistor, which in turn yields better phase noise.

The first step-up transformer 1005 acts as an impedance transformer and the loading due to the finite output impedance and overlap capacitances of the MOS devices seen at the output port is attenuated by a factor of n-squared. Here n=2; the choice is partly motivated by the ease and accuracy of modeling an interleaved transformer with a turns ratio of 2, compared to a greater number. This attenuation in impedance can be used to obtain fine tuning steps, as addition of any capacitance to the primary of the first step-up transformer 1005 will be seen at the output port reduced by a factor of n-squared. Specifically, the finest capacitance step that the advanced CMOS lithography can readily deliver with high resolution is about 40 aF, which corresponds to about 12 kHz at the 2 GHz RF output frequency. The down-scaling can be achieved through the transformer turns ratio, but other impedance transformation methods could be used.

The oscillator circuit 1000 improves phase noise on the following basis according to an implementation form: The time span of noise-insensitivity is increased by subjecting the active devices to large driving signals, which forces the device to compress and, therefore, the output to clip. Furthermore, the clipped waveform is filtered in the secondary winding of the transformer to recover a sinusoidal signal which drives the gates. The swing of the signal driving the gate-terminals of the active devices is not limited by Vdd. The signal swing can exceed the 2*Vdd limitation of conventional cross-coupled negative ($-g_m$) oscillators. The 'rise time' of the output signal decreases with increase in input voltage amplitude. This reduces noise to phase-noise conversion as well.

Removing the tail-current source eliminates its noise, but frequency-pushing due to supply variation increases. Desensitization capacitors $C_{F1}$ mitigate the bias dependency of parasitic capacitances, which causes change in oscillation frequency. This also mitigates frequency dependence on bias voltage $V_B$. The measured frequency pushing is <16 MHz, which is the best reported to date. The lowering effect that capacitances $C_{F1}$ have on the output swing, is compensated with power consumption.

The output may be taken via a capacitive tap ($C_X$, $C_Y$) to minimize loading from buffers interfacing the oscillator to a dynamic frequency divider. Four switched MOM-capacitors (B0-B3) across the primary of Tx2 provide coarse frequency tuning. Control bits $b_0$-$b_1$ fine-tune the impedance seen at the secondary of Tx1. Their impact on operating frequency results in fine-tuning, due to the attenuation in impedance by a factor of n-squared (here n=2) caused by transformer Tx1. Similarly, any capacitance in parallel to $C_{F1}$ will appear magnified by a factor of n-squared at the output and can be used for area-minimized coarse tuning.

The impedance transformation can be exploited to obtain both fine and coarse frequency tuning. The oscillator is shown in FIG. 10 along with the three tuning ports controlled with $C_{TN}$, $C_{F1}$ and $C_{T2}$. As discussed earlier $C_{T2}$ provides fine tuning while $C_{TN}$ provides the normal coarse tuning. Amplification of capacitance is observed at the output when $C_{F1}$ is varied. This provides an additional degree of coarse tuning, which allows us to maximize the frequency dynamic range while minimizing the capacitive dynamic range. A further benefit of the amplification of capacitance is, that a smaller capacitance (i.e., smaller geometry) with a lower series resistance (i.e., a higher Q) degrades the phase noise less.

Figure 11:
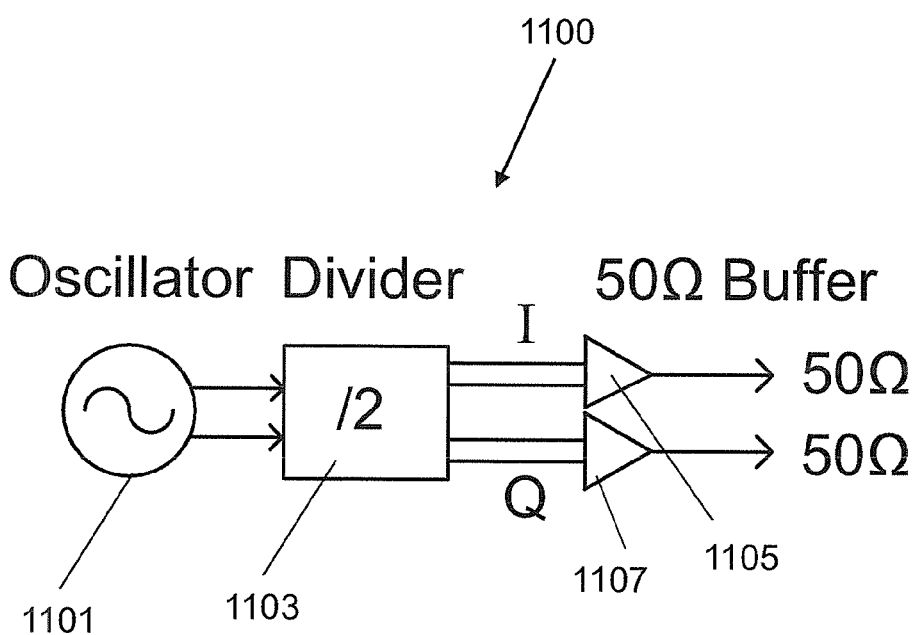
FIG. 11 shows a block diagram of an integrated circuit comprising an oscillator circuit according to an implementation form.

FIG. 11 shows a block diagram of a part of an integrated circuit 1100 comprising an oscillator circuit 1101 according to an implementation form. The integrated circuit could be an RF transceiver or it could be an RF-SoC (system on a chip) for cellular handsets or base stations. The oscillator circuit 1101 is followed by a dynamic frequency divider 1103 which generates quadrature outputs. Power matched buffers 1105 and 1107 are implemented to drive the 50 ohm measurement environment.

Figure 12:
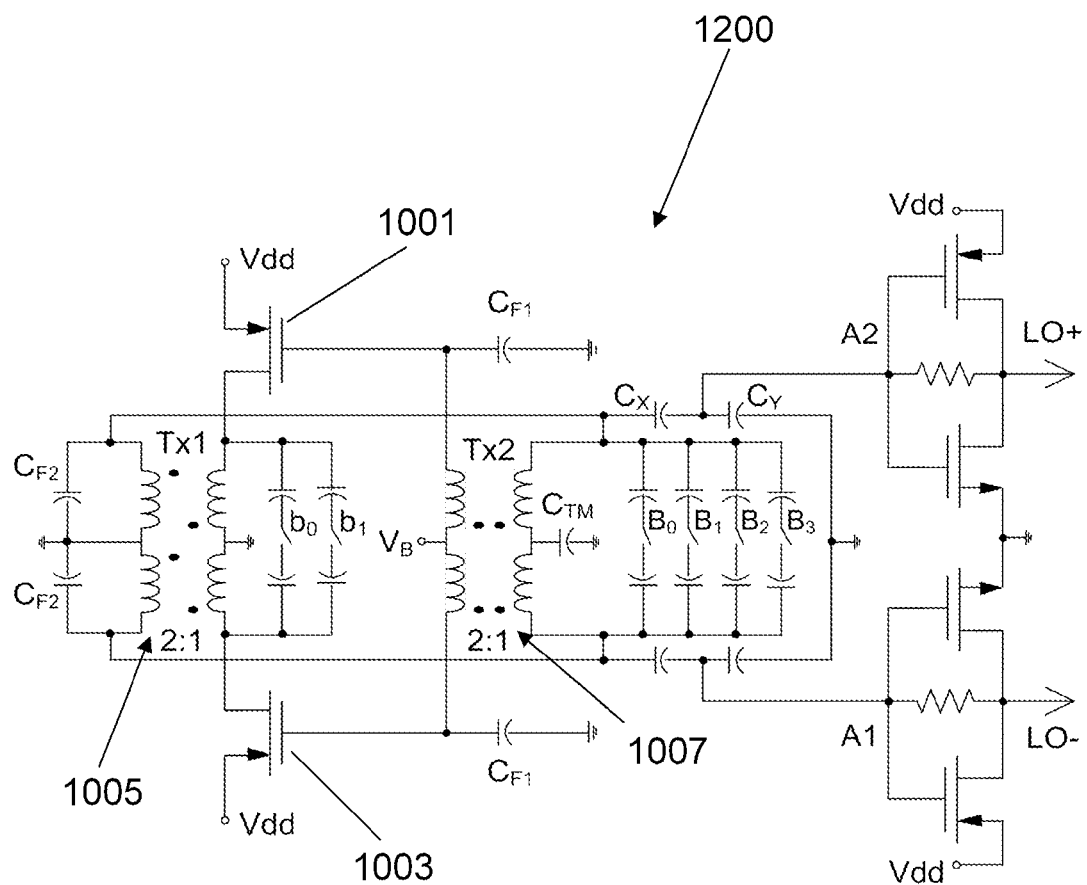
FIG. 12 shows a block diagram of an oscillator circuit according to an implementation form.

FIG. 12 shows a block diagram of an oscillator circuit 1200 forming an implementation form of the oscillator circuit 1000 shown in FIG. 10.

According to an implementation form, frequency tuning circuits ($B_0$-$B_3$) are used across the primary winding of the second step-up transformer 1007, which may also form the output port, to accurately target the GSM-band after division by a factor of 4. The tuning circuits are implemented by switches switching at least two capacitors (i.e., differential) in series.

According to an implementation form, further frequency tuning circuits ($b_0$-$b_1$) may used to verify impedance attenuation in the form of smaller tuning steps. The tuning circuits are implemented by switches switching at least two capacitors in series. The output is through a capacitive tap $C_X$, $C_Y$ from the oscillator to minimize loading of the tank. Shunt-feedback interface buffers A1, A2 set the output common-mode to Vdd/2, which ensures symmetric drive of the dynamic divider while amplifying the signal as well. Bias control is obtained through $V_B$. This node is sensitive to low-frequency noise, which gets up-converted to phase-noise around the RF carrier. According to an implementation form, the bias voltage is generated locally on a chip.

PMOS devices have been preferred over NMOS devices for circuit design, since they demonstrate lower 1/f noise for the same bias current.

According to an implementation form, the four tuning bits ($B_0$-$B_3$) can be used across the primary winding of Tx2, which is also the output port, to accurately target the GSM-band after division by a factor of e.g. 4. Secondary tuning ($b_0$-$b_1$), can be used to verify impedance attenuation in the form of smaller tuning steps. The output is through a capacitive tap ($C_X$, $C_Y$) from the resonator to minimize loading of the tank. Shunt-feedback interface buffers (A1, A2) set the output common-mode to Vdd/2, which ensures symmetric drive of the dynamic divider while amplifying the signal as well. Bias control is obtained through $V_B$. This node is sensitive to low-frequency noise, which gets up-converted to phase-noise around the RF carrier. Care needs to be taken while designing the decoupling network for this node, and the cleanest available supply should be used. From a product point of view, the bias voltage should ideally be generated locally on chip itself.

As explained in the previous section, an advantage of this topology is the high swing that can be obtained, which is not limited to 2*Vdd. The large signal drive at the gate ensures larger peak signal current and a faster rise time, which improves phase noise. 2.5V devices have been used in the circuit since they have a higher breakdown limit and can withstand the high voltage swing. Operated from a 1.2 V supply, the high $V_{th}$ of 2.5 V devices (~550 mV) results in lower $g_m$ for a given bias current. Conversely, this expedites the clipping process we are targeting, which increases the time window of noise insensitivity. The role of the two step-up transformers with regard to amplitude amplification and filtering gets re-iterated here, as device noise contribution depends on the amplitude signal driving the gate or the input amplitude, and not the amplitude seen at the drain or the output amplitude.

The step-up transformers Tx1 and Tx2, 1005, 1007, have according to an implementation form a turn ratio of 2. They have been designed by stacking the top 3 metal layers due to the unavailability of a thick metal. The top two copper metals are 0.9 um thick, while the thickness of aluminum layer is 1.4 um.

Figure 13:
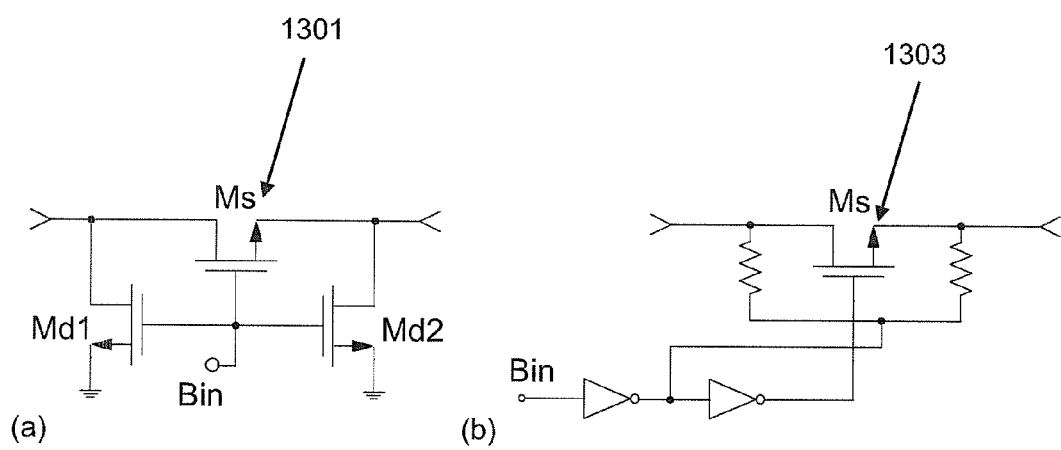
FIG. 13a shows a block diagram of a digital switch used in an oscillator circuit according to an implementation form.
FIG. 13b shows a block diagram of a digital switch used in an oscillator circuit according to an implementation form.

FIGS. 13a and 13b show a block diagrams of digital switches 1301, 1303 used in an oscillator circuit according to an implementation form.

Differential switching offers the benefit of an improved capacitor Q, since a single switch presents only a single ON-resistance in series with the capacitor. The use of a single switch can also be seen as an improvement in frequency capability, as the parasitic capacitances are reduced.

In the switch 1301 shown in FIG. 13a, Ms is the central switching element, while Md1 and Md2 are devices with a large gate length and short gate width, which set the DC voltage at the floating source and drain terminals of Ms, when the switch is ON. In the off-state the terminals remain floating. Leakage currents through parasitic diodes might set the drain and source node voltage to 0 Volts.

In the switch 1303 shown in FIG. 13b, the resistors pull down (or pull up) the source and drain nodes when the switch is turned ON (or OFF). The inverters do not consume any static power and occupy little area. Along with the resistors, they ensure that the transistor gate-source voltage is negative during OFF-state and maximum in the ON-state. The drain bias during OFF-state is set to Vdd in this switch configuration. This provides better control over the capacitance due to the reverse biased drain-bulk junction. And also reduces signal leakage through the drain-bulk junction.

An alternate implementation form of the concept of the switch 1303 described in FIG. 13b is obtained by the addition of PMOS devices, similar to Md1 and Md2, to the structure in FIG. 13a, with their gate connected to Bin as well. In the off-state the PMOS devices pull up the source and drain node of the central switching element. The drawback is the additional capacitance introduced by the PMOS devices, and while the switch itself is OFF, the PMOS devices remain ON, resulting in signal leakage.

With respect to FIGS. 13a and 13b, differential switching offers the benefit of an improved capacitor Q, since a single switch presents only a single ON-resistance in series with the capacitor. The use of a single switch can also be seen as an improvement in frequency capability, as the parasitic capacitances are reduced.

As to FIG. 13a, Ms is the central switching element, while Md1 and Md2 are devices with a large gate-length and short gate width, which set the DC voltage at the floating source and drain terminals of Ms, when the switch is ON. In the off-state the terminals remain floating. Leakage currents through parasitic diodes might set the drain (and source) node voltage to 0 Volts.

In the switch shown in FIG. 13b, the resistors pull down (or pull up) the source and drain nodes when the switch is turned ON (or OFF). The inverters do not consume any static power and occupy little area. Along with the resistors, they ensure that the transistor gate-source voltage is negative during OFF-state and maximum in the ON-state. The drain bias during OFF-state is set to Vdd in this switch configuration. This provides better control over the capacitance due to the reverse biased drain-bulk junction. And also reduces signal leakage through the drain-bulk junction which results in signal clipping.

Figure 14:
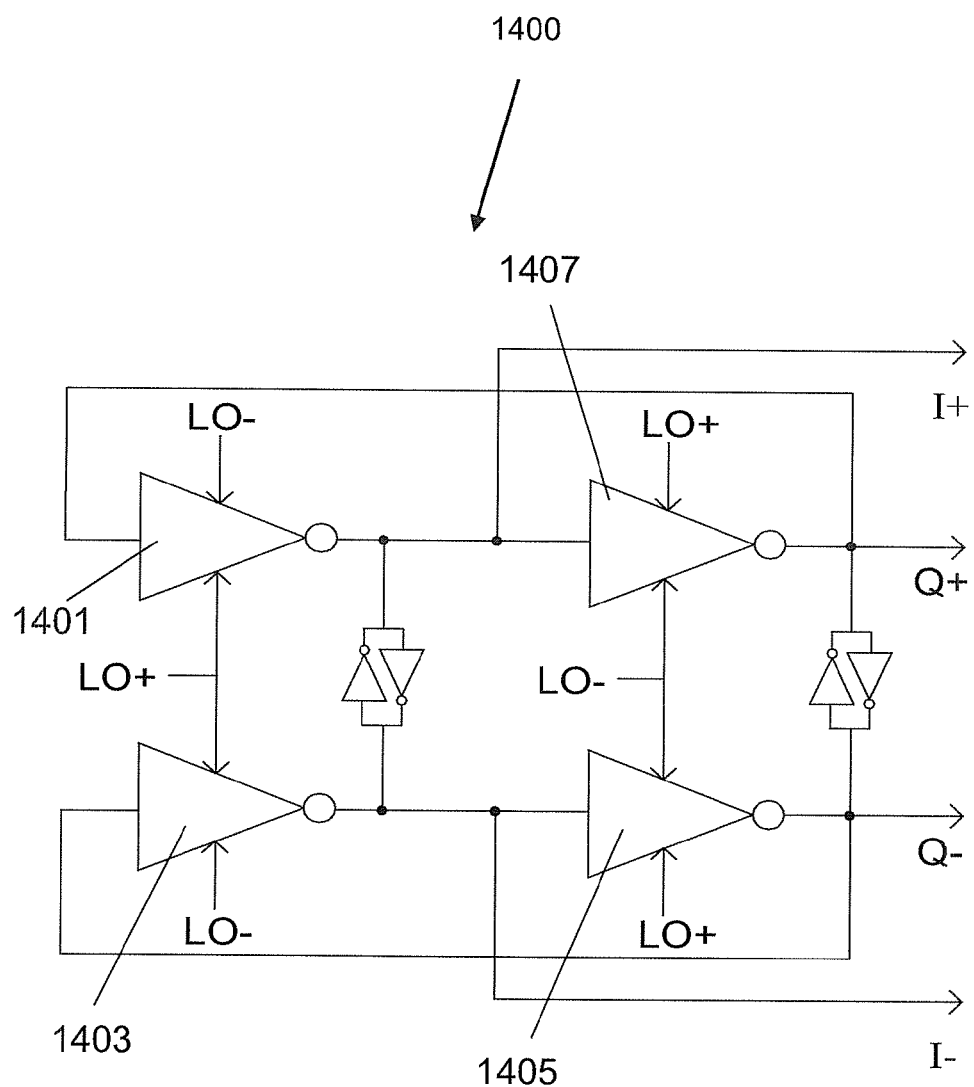
FIG. 14 shows a block diagram of a dynamic frequency divider used in an integrated circuit comprising an oscillator circuit according to an implementation form.

FIG. 14 shows a block diagram of a dynamic frequency divider 1400 with inverters 1401, 1403, 1405, 1407 used in an integrated circuit comprising an oscillator circuit according to an implementation form. Compared to static dividers, dynamic dividers have a lower bandwidth. The advantage of dynamic dividers is their lower power consumption and noise-floor. The dynamic divider that has been implemented is shown in FIG. 14.

The circuit can be driven differentially with an amplitude that is large enough to prevent self-oscillation. Cross coupled inverters are used to ensure opposite polarity in the respective nodes they connect. The gain of these cross coupled inverters can be designed to trade thermal noise floor, for edge alignment ability.

Figure 15:
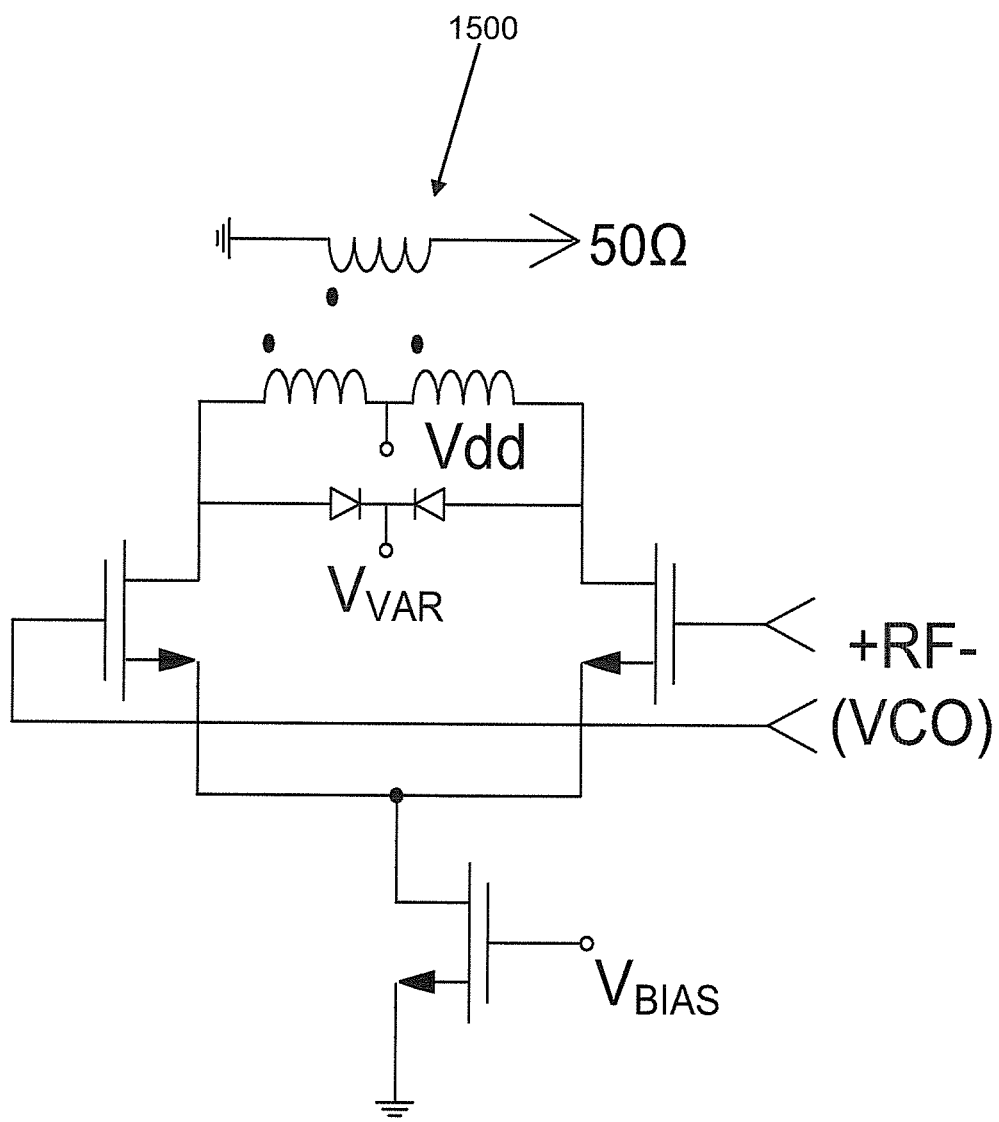
FIG. 15 shows a block diagram of an output buffer used in an integrated circuit comprising an oscillator circuit according to an implementation form.

FIG. 15 shows a block diagram of an output buffer 1500 used in an integrated circuit comprising an oscillator circuit according to an implementation form.

For phase noise measurement, the output buffer 1500 consisting of a differential pair with a differential-to-single-ended transformer load, as shown in FIG. 15, is used to drive the 50Ω measurement equipment. Biasing voltage $V_{BIAS}$ can be used to adjust the gain. The transformer provides impedance matching over a wide bandwidth, and can be tuned to the operating frequency by adjusting $V_{VAR}$, trading bandwidth for $S_{21}$.

Figure 16:
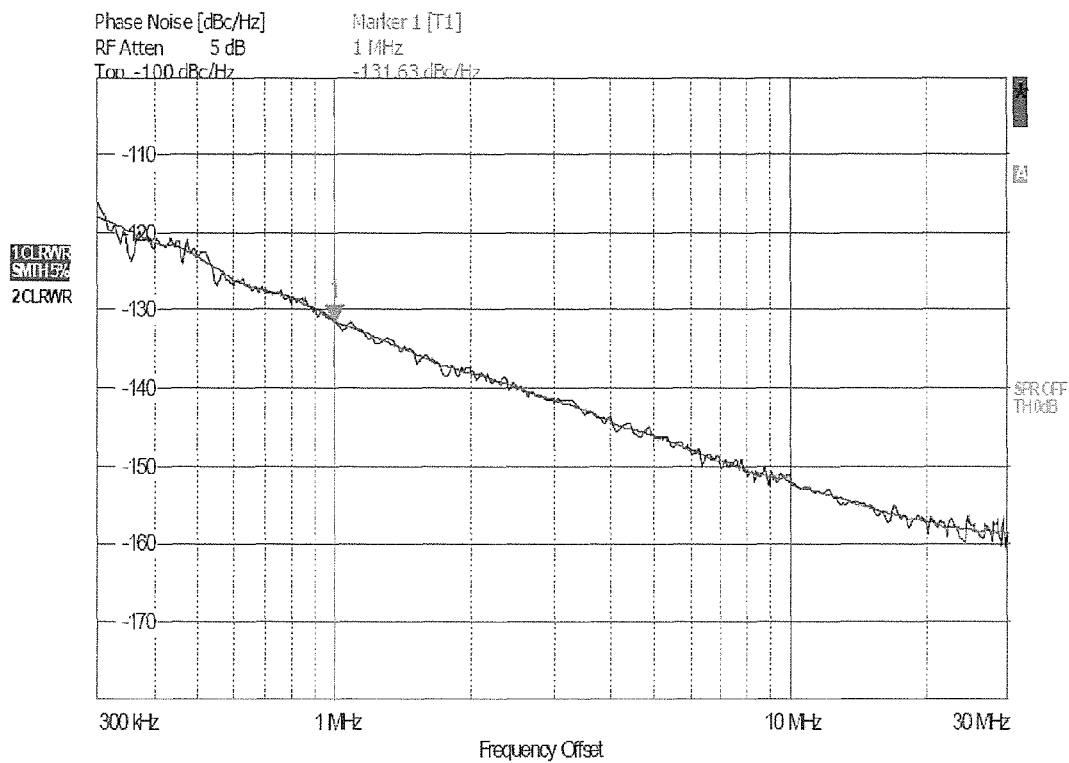
FIG. 16 shows a phase noise measurement at maximum current consumption of an oscillator circuit according to an implementation form.

FIG. 16 shows a phase noise measurement at maximum current consumption of an oscillator circuit according to an implementation form. A spectrum analyzer screenshot of phase noise measurement at the maximum (21 mA) current consumption is shown. The carrier frequency after division by 2 is 3.95 GHz.

From FIG. 16 we see that the phase noise at 1 MHz offset is −131.7 dBc/Hz and at 3 MHz offset is 142.12 dBc/Hz. The corresponding figure of merit obtained at these offset frequencies is 189.55 dBc/Hz and 190.5 dBc/Hz.

Figure 17:
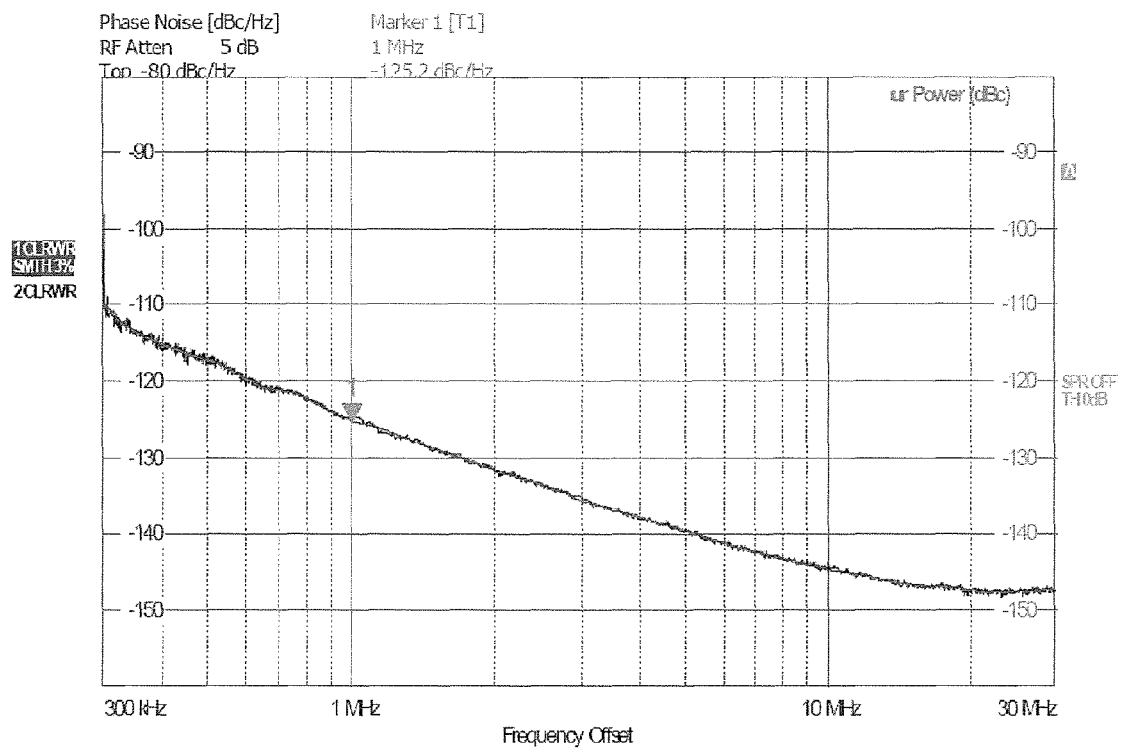
FIG. 17 shows a phase noise measurement at minimum current consumption of an oscillator circuit according to an implementation form.

FIG. 17 shows a phase noise measurement at minimum current consumption of an oscillator circuit according to an implementation form. A spectrum analyzer screenshot of phase noise measurement at the minimum current consumption, e.g. 16 mA, is shown. The carrier frequency after division by 2 is 3.95 GHz.

Figure 18:
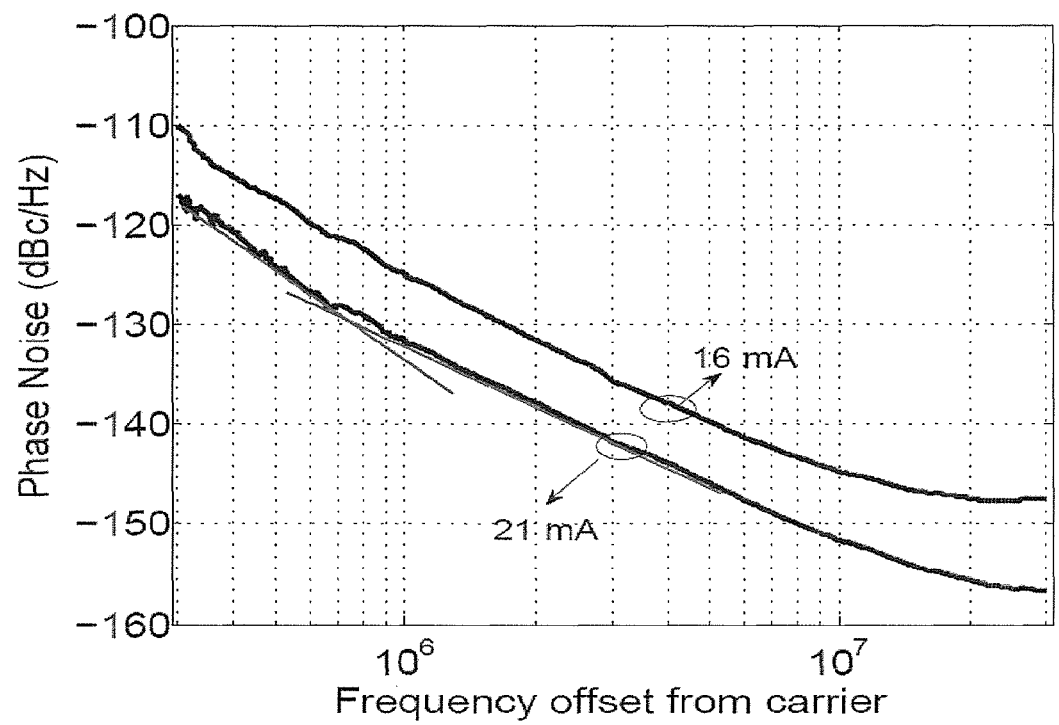
FIG. 18 shows a phase noise measurement at low (16 mA) and high (21 mA) current consumption of an oscillator circuit according to an implementation form.

FIG. 18 shows a phase noise measurement at low (16 mA) and high (21 mA) current consumption of an oscillator circuit according to an implementation form. For low current consumption, the phase noise is higher than for high current consumption.

Figure 19:
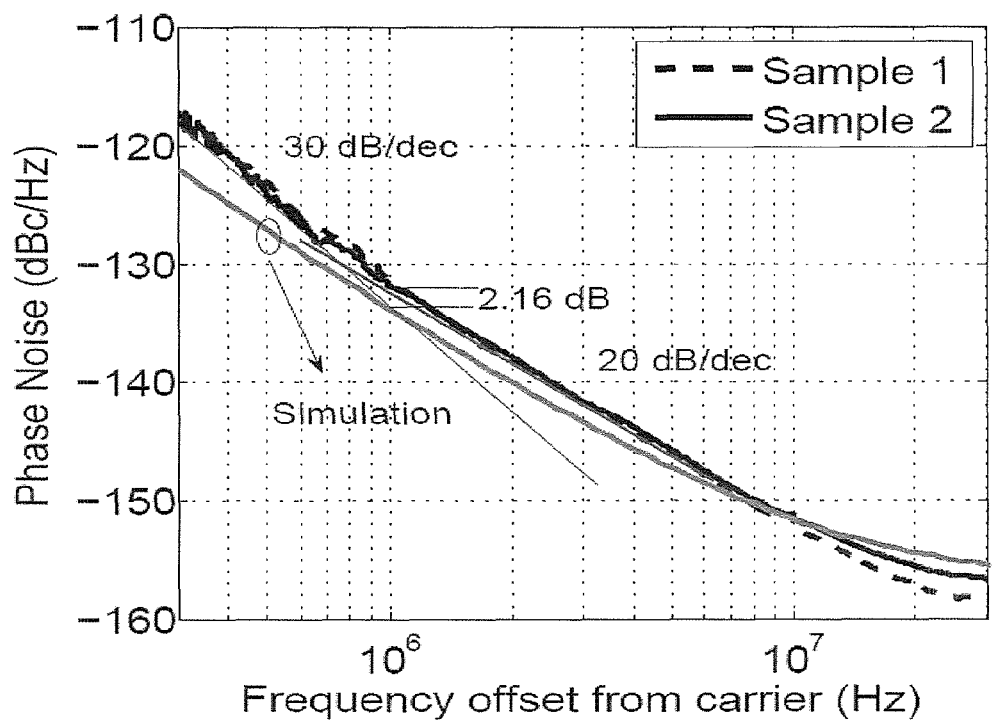
FIG. 19 shows a phase noise measurement for two different samples of an oscillator circuit according to an implementation form.

FIG. 19 shows a phase noise measurement for two different samples of an oscillator circuit according to an implementation form. As depicted in FIG. 19, there is no significant difference between the two samples.

Figure 20:
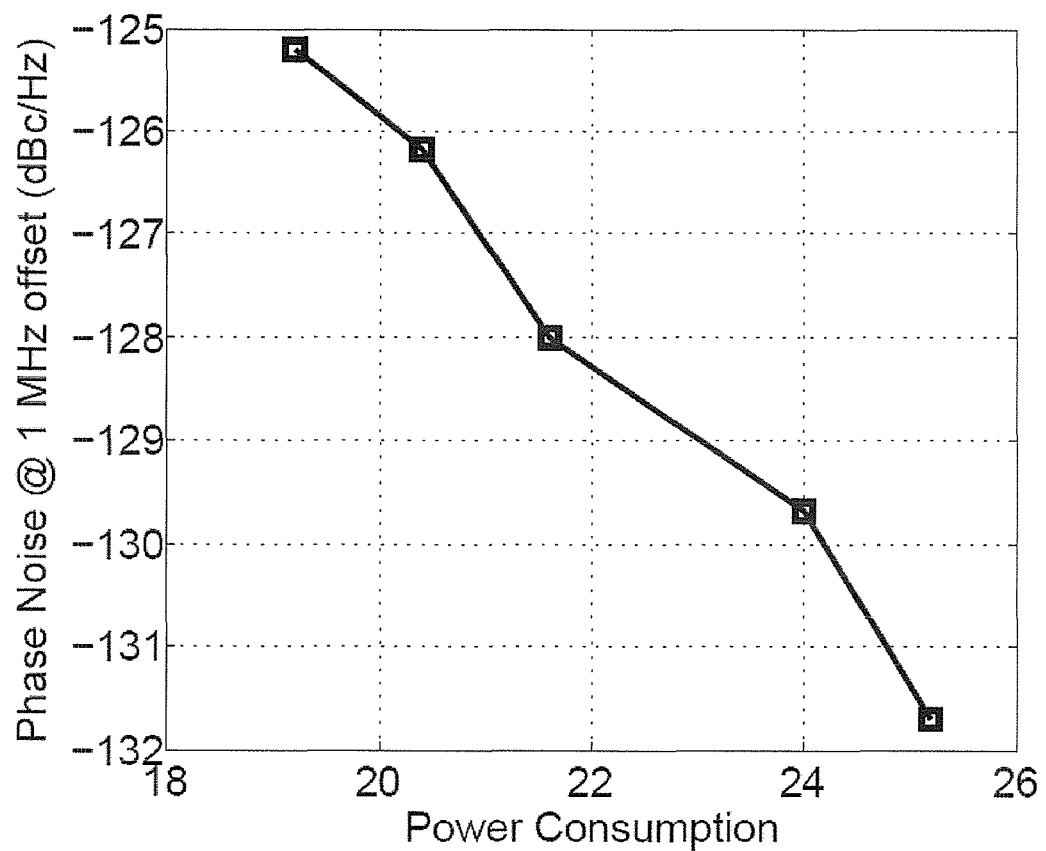
FIG. 20 shows a phase noise measurement versus power consumption of an oscillator circuit according to an implementation form.

FIG. 20 shows a phase noise measurement versus power consumption of an oscillator circuit according to an implementation form. The phase noise of the circuit is seen to improve with increase in current consumption.

Figure 21:
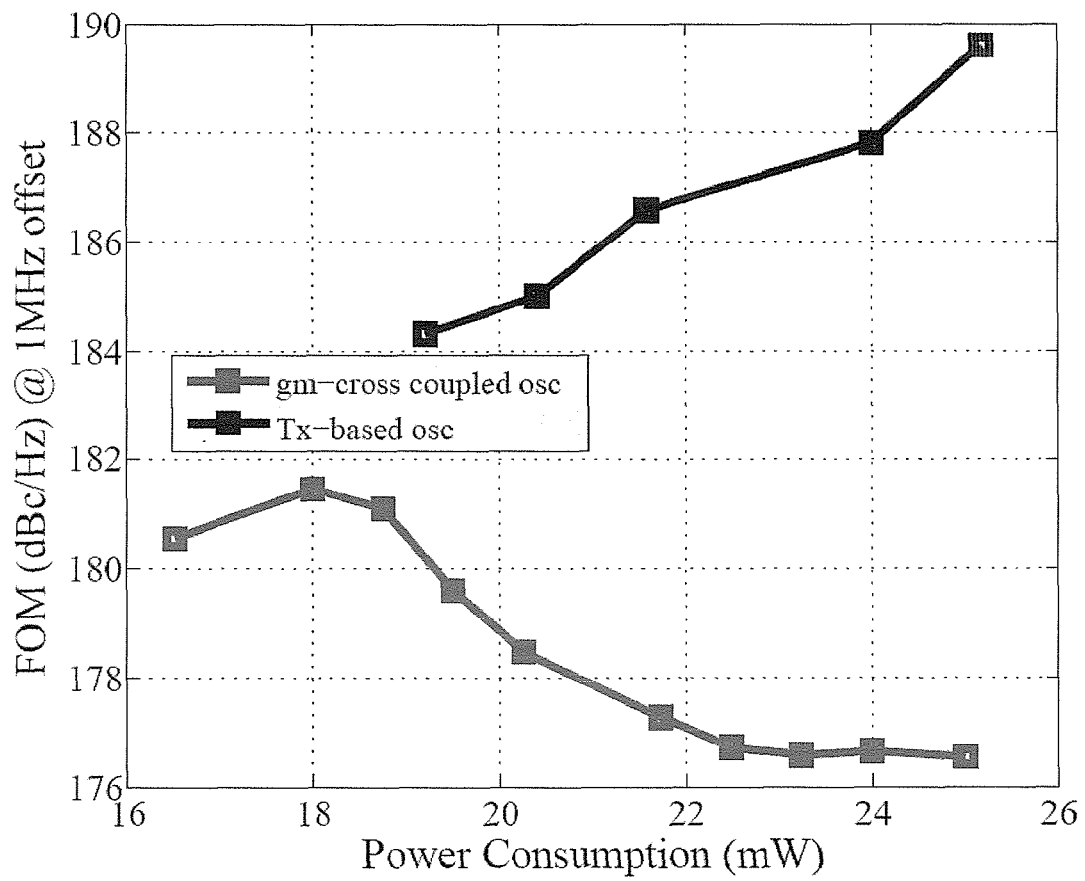
FIG. 21 shows a graph depicting the figure of merit for a reference oscillator and for an oscillator circuit according to an implementation form.

FIG. 21 shows a graph depicting the figure of merit for a reference oscillator and for an oscillator circuit according to an implementation form.

For the negative (−gm) cross coupled oscillator fabricated for a reference oscillator, we see that its figure of merit (FOM) reduces when the oscillator transitions into the voltage-limited mode. The FOM of the designed oscillator corresponding to the oscillator circuit according to implementation forms increases as the devices compress. Also, the designed oscillator obtains a phase noise which is 8 dB less than the reference oscillator.

Figure 22:
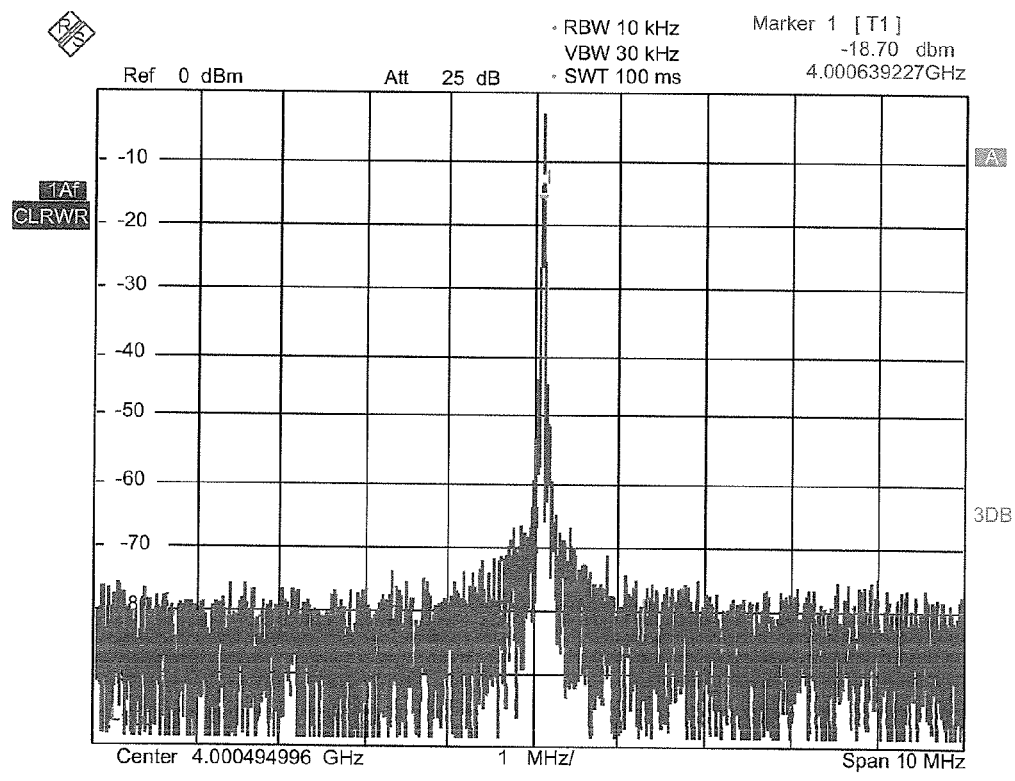
FIG. 22 shows a spectral diagram of an output signal of an oscillator circuit according to an implementation form at high end of frequency tuning range.

FIG. 22 shows a spectral diagram of an output signal of an oscillator circuit according to an implementation form at high end of frequency tuning range. The frequency marker is positioned at the main frequency peak at a frequency of 4 GHz.

Figure 23:
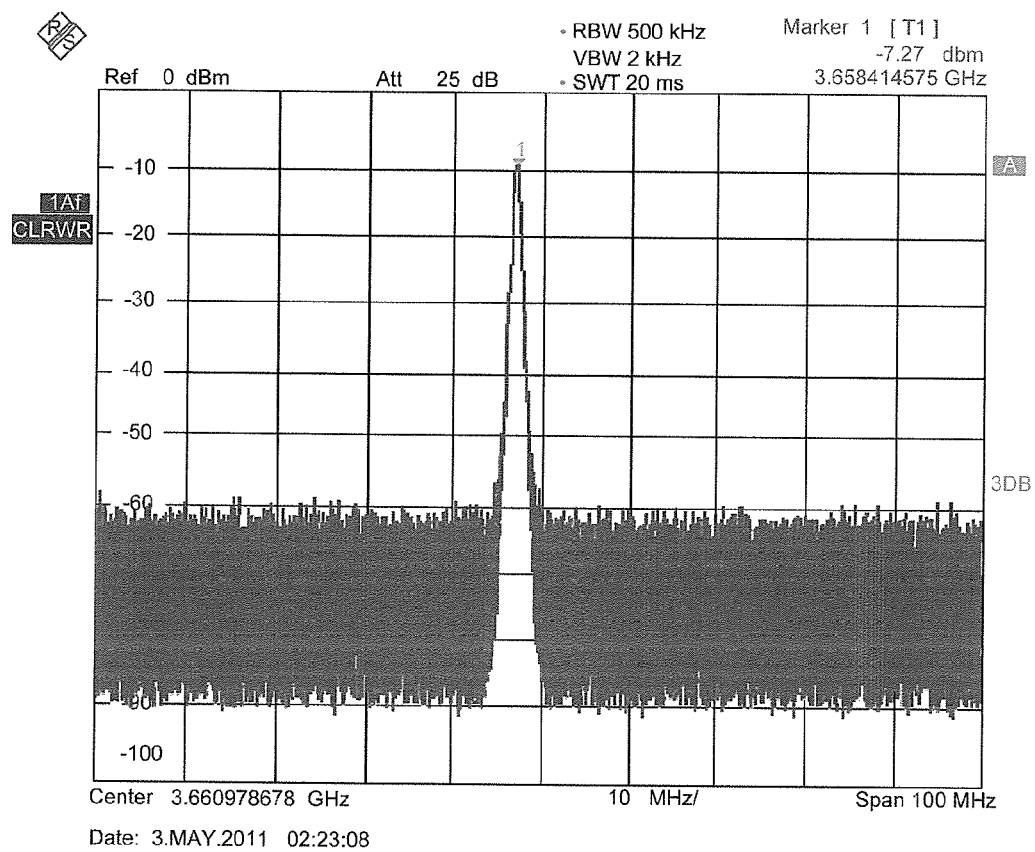
FIG. 23 shows a spectral diagram of an output signal of an oscillator circuit according to an implementation form at low end of frequency tuning range.

FIG. 23 shows a spectral diagram of an output signal of an oscillator circuit according to an implementation form at low end of frequency tuning range. The frequency marker is positioned at the main frequency peak at a frequency of 3.65 GHz.

The measured tuning range is from 3.65 to 4.02 GHz, which is 9.65%. The focal point of the test-chip was to obtain measured confirmation of the concept being targeted. The tuning range was not a targeted specification, though it can be extended by the addition of more tuning bits realized by tuning circuits as e.g. depicted in FIG. 12.

Figure 24:
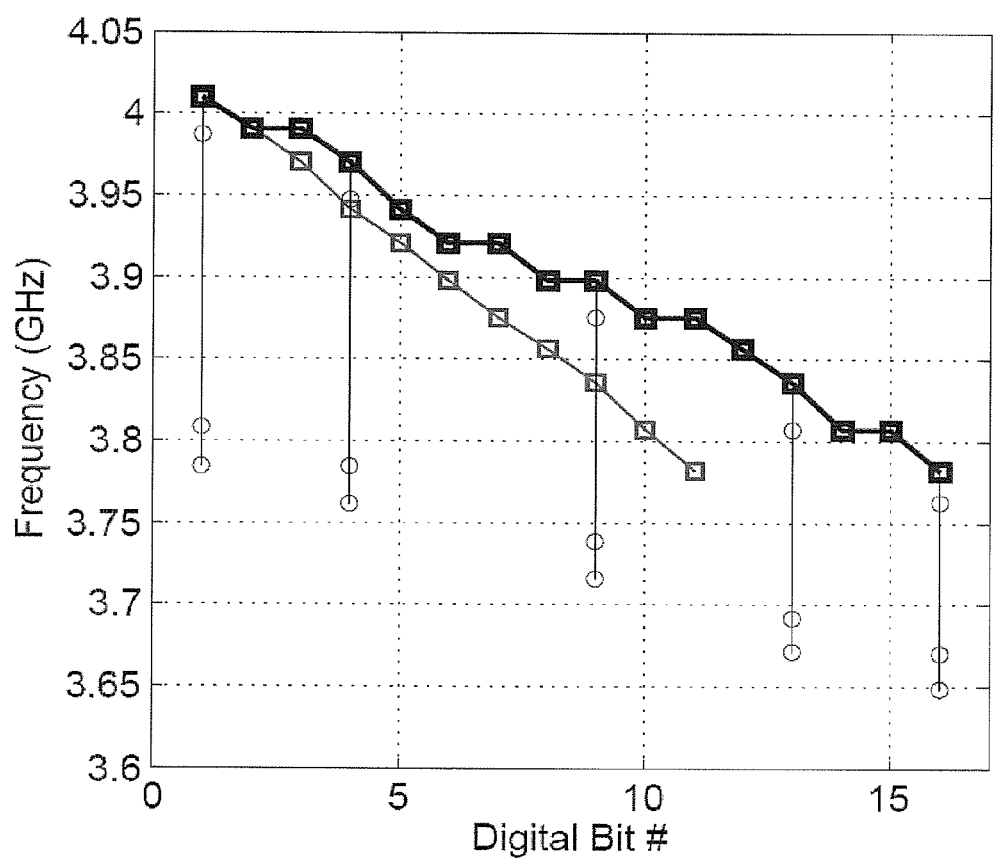
FIG. 24 shows a graph depicting the variation of frequency with digital tuning bits for an oscillator circuit according to an implementation form.

FIG. 24 shows a graph depicting the variation of frequency with digital tuning bits for an oscillator circuit according to an implementation form. Depending on the tuning bits, the oscillation frequency can be adjusted.

Figure 25:
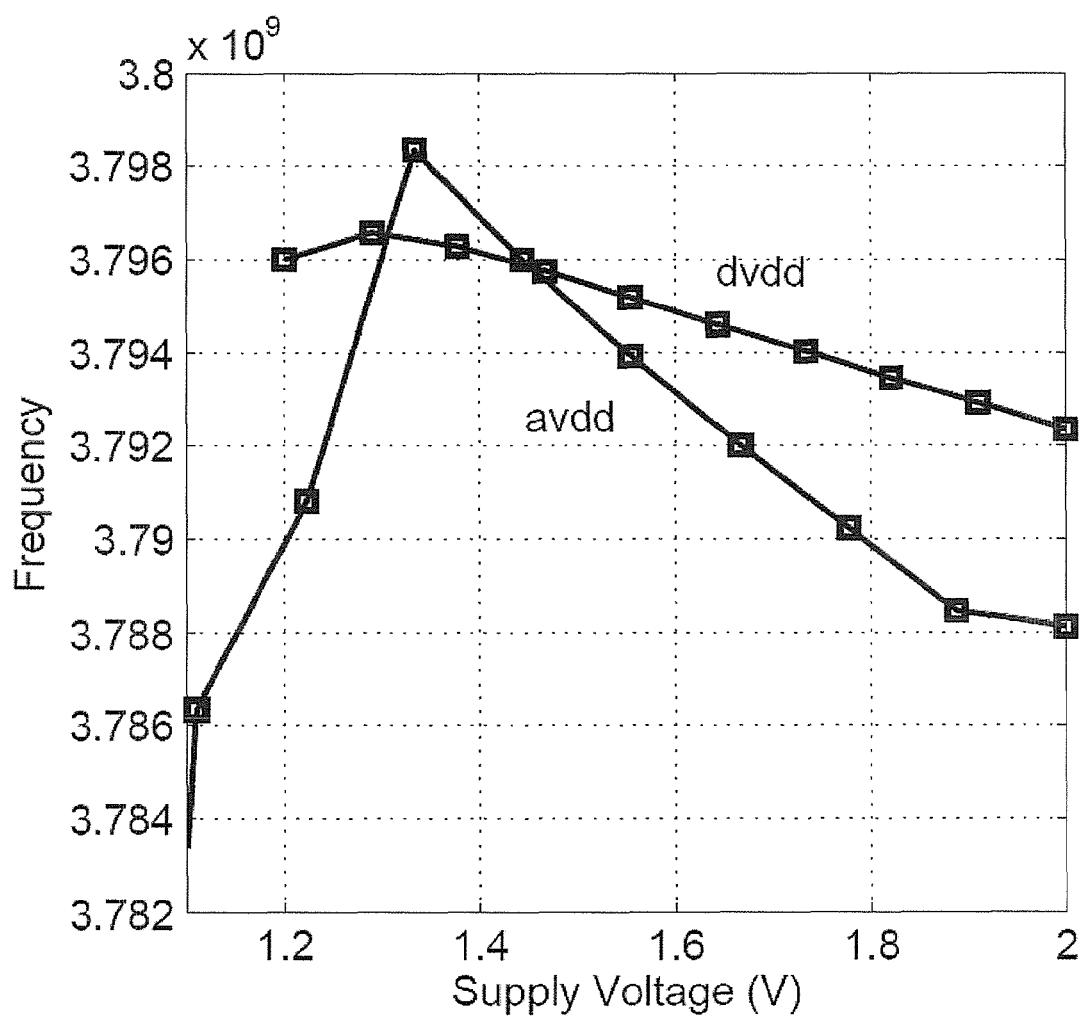
FIG. 25 shows a graph depicting the variation of frequency with analog and digital supply voltage for an oscillator circuit according to an implementation form.

FIG. 25 shows a graph depicting the variation of frequency with analog and digital supply voltage for an oscillator circuit according to an implementation form. Depending on the analog and digital supply voltages, the oscillation frequency can be adjusted. The frequency pushing of the oscillator is plotted in FIG. 25. Separate analog and digital supply voltages have been used in the chip. The supply voltages were varied from 1.1 to 2 V and the change in output frequency was measured. It can be seen that the variation in output frequency is 4 MHz with change in digital supply while a MHz variation is seen with the change in analog supply voltage.

Figure 26:
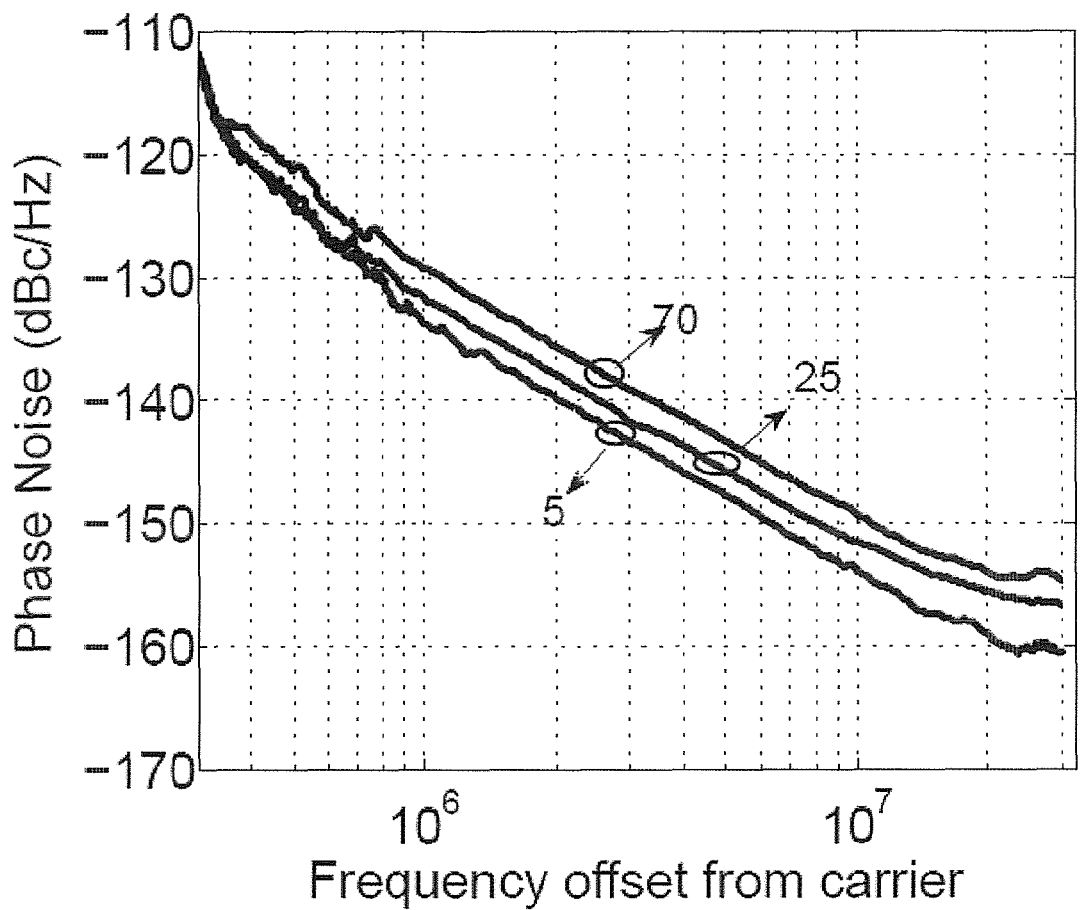
FIG. 26 shows a graph depicting the variation of phase noise with temperature for an oscillator circuit according to an implementation form.

FIG. 26 shows a graph depicting the variation of phase noise with temperature for an oscillator circuit according to an implementation form. Depending on temperature, different phase noise levels can be obtained. The lower the temperature the smaller the phase noise.

Figure 27:
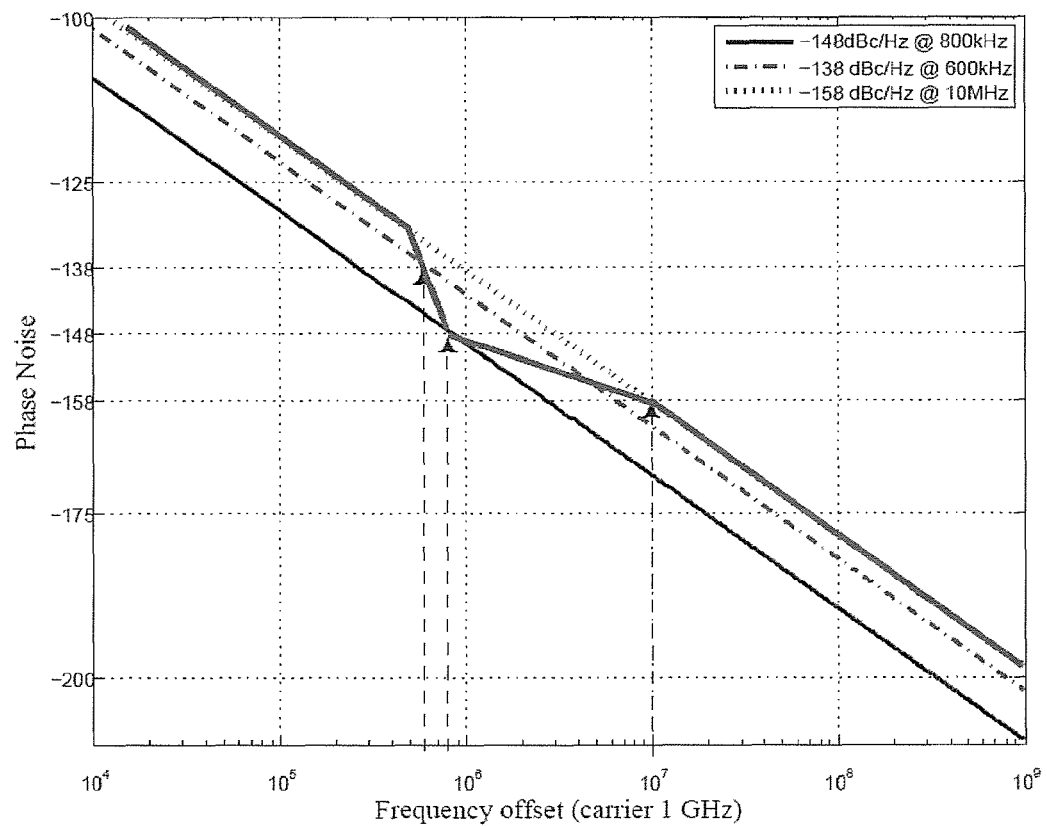
FIG. 27 shows a graph depicting phase noise targets depending on the frequency offset of an oscillator circuit according to an implementation form.

FIG. 27 shows a graph depicting phase noise targets depending on the frequency offset of an oscillator circuit according to an implementation form.

The specified phase noise targets and the measured results obtained according to an implementation form are listed in Table 1.

TABLE 1 specified phase noise targets and measured results

| PHASE NOISE | TARGET | MEASURED (NORMALIZED TO A 1 GHZ CARRIER) |
|---|---|---|
| @ 600 KHZ | −138 DBc/Hz | −138.7 DBC/Hz |
| @ 800 KHZ | −148 DBC/HZ | −142.7 DBC/HZ |
| @ 10 MHZ | −158 DBC/Hz | −164.6 DBC/Hz |
| @ 20 MHZ | N/A | **−169.2 DBC/Hz |

Measurements with a possible parameter set for the oscillation circuit are listed in Table 2.

TABLE 2

Measurements with a possible parameter set for the oscillation circuit

| Technology | 65 nm CMOS | |
| Supply Voltage | 1.2 V | |
| Operating Frequency | 8 GHz | |
| Measured frequency after frequency division | 4 GHz | |
| Tuning range | 3.65-4.03 GHz (9.7%) | |
| Phase noise @ 1 MHz offset (dBc/Hz) | 25.2 mW −131.63 | 19.2 mW −125.2 |
| Phase noise @ 1 MHz normalized to 1 GHz carrier | −143.63 dBc/Hz | |
| Phase noise @ 20 MHz normalized to 1 GHz carrier | −169.2 dBc/Hz | |
| Maximum power consumption | 25.2 mW | |
| Frequency Pushing (dvdd) | 4 MHz/V | |
| Frequency Pushing (avdd) | 14 MHz/V | |
| FOM (dBc/Hz) | 1 MHz 189.55 | 3 MHz 190.5 |

The present disclosure also supports a computer program product including computer executable code or computer executable instructions that, when executed, causes at least one computer to execute the performing and computing steps described herein.

The present disclosure also supports a system configured to execute the performing and computing steps described herein.

Many alternatives, modifications, and variations will be apparent to those skilled in the art in light of the above teachings. Of course, those skilled in the art readily recognize that there are numerous applications of the invention beyond those described herein. While the present inventions has been described with reference to one or more particular embodiments, those skilled in the art recognize that many changes may be made thereto without departing from the scope of the present invention. It is therefore to be understood that within the scope of the appended claims and their equivalents, the inventions may be practiced otherwise than as specifically described herein.

What is claimed is:

1. An oscillator circuit, comprising:
   a clipping element for generating a clipped signal;
   a first amplification stage for amplifying and filtering the clipped signal to obtain a first filtered signal, the first filtered signal comprising an oscillation;
   a second amplification stage for amplifying the first filtered signal to obtain an amplified filtered signal as a second filtered signal; wherein
   the clipping element is configured to generate the clipped signal upon the basis of the second filtered signal, and
   the second amplification stage comprises a step-up transformer, and wherein a secondary winding of the step-up transformer is coupled to the clipping element.

2. The oscillator circuit of claim 1, wherein the first amplification stage comprises a passive amplifier for amplifying the clipped signal and a filter for filtering the amplified clipped signal to obtain the first filtered signal.

3. The oscillator circuit of claim 1, wherein either the first amplification stage or the second amplification stage is configured to introduce a phase shift by 180°.

4. The oscillator circuit of claim 1, wherein the first amplification stage is configured for suppressing frequency tones different from a fundamental tone in the clipped signal.

5. The oscillator circuit of claim 1, wherein the first amplification stage comprises an impedance step-up transformer with a primary winding and a secondary winding, wherein an output of the clipping element is coupled to the primary winding.

6. The oscillator circuit of claim 1, wherein the first amplification stage comprises an impedance step-up transformer for amplifying the clipped signal and a filter coupled to a secondary winding of the impedance step-up transformer for filtering the amplified clipped signal to obtain the first filtered signal, wherein the second amplification stage comprises a step-up transformer, and wherein the secondary winding of the impedance step-up transformer of the first amplification stage is coupled to a primary winding of the step-up transformer of the second amplification stage.

7. The oscillator circuit of claim 1, wherein an output of the second amplification stage is coupled to an input of the clipping element.

8. The oscillator circuit of claim 1, wherein the clipping element comprises at least a MOS transistor for clipping, and wherein an output of the second amplification stage is coupled to a gate terminal of the MOS transistor.

9. The oscillator circuit of claim 1, wherein the clipping element comprises an amplifier and a clipping diode arranged downstream of the amplifier.

10. The oscillator circuit of claim 9, wherein the amplifier is configured to introduce a phase shift of 180°.

11. The oscillator circuit of claim 1, wherein at least one switchable frequency tuning circuit is coupled to an input of the second amplification stage.

12. The oscillator circuit of claim 1, further comprising a further clipping element for generating a further clipped signal;
wherein the first amplification stage is configured for amplifying and filtering the further clipped signal to obtain a further filtered signal; and wherein
the further clipping element is configured to generate the further clipped signal upon the basis of the further filtered signal.

13. The oscillator circuit of claim 1, wherein at least one switchable frequency tuning circuit is coupled to an input of the first amplification stage.

14. The oscillator circuit of claim 1, wherein a control input of the clipping element is coupled to a desensitizing capacitor.

* * * * *